United States Patent [19]
Allie et al.

[11] Patent Number: 4,736,431
[45] Date of Patent: Apr. 5, 1988

[54] ACTIVE ATTENUATION SYSTEM WITH INCREASED DYNAMIC RANGE

[75] Inventors: Mark C. Allie, Oregon; Geoffrey S. Bailey, Madison, both of Wis.

[73] Assignee: Nelson Industries, Inc., Stoughton, Wis.

[21] Appl. No.: 922,282

[22] Filed: Oct. 23, 1986

[51] Int. Cl.$^4$ .......................................... H04B 15/00
[52] U.S. Cl. ........................................ 381/71; 381/94
[58] Field of Search ................... 381/71, 73.1, 94, 92, 381/96

[56] References Cited

U.S. PATENT DOCUMENTS

| | | |
|---|---|---|
| 4,025,724 | 6/1977 | Davidson, Jr. et al. |
| 4,473,906 | 1/1984 | Warnaka et al. ....................... 381/71 |
| 4,480,333 | 10/1984 | Ross ....................................... 381/71 |
| 4,489,441 | 12/1984 | Chaplin ................................. 381/71 |
| 4,490,841 | 12/1984 | Chaplin ................................. 381/71 |
| 4,527,282 | 7/1985 | Chaplin ................................. 381/71 |
| 4,562,589 | 12/1985 | Warnaka ............................... 381/71 |
| 4,589,133 | 5/1986 | Swinbanks ............................ 381/71 |
| 4,589,137 | 5/1986 | Miller .................................... 381/94 |
| 4,596,033 | 6/1986 | Swinbanks ............................ 381/71 |

OTHER PUBLICATIONS

"Active Noise Reduction Systems in Ducts", J. Tichy, G. E. Warnaka and L. A. Poole, ASME Journal, Nov. 1984, pp. 1–7, FIG. 7.
"Historical Review and Recent Development of Active Attenuators", H. G. Leventhall, Acoustical Society of America, 104th Meeting, Orlando, Nov. 1982, FIG. 8.
Active Adaptive Sound Control in a Duct: A Computer Simulation", J. C. Burgess, Journal of Acoustic Society of America, 70(3), Sep. 1981.
"The Implementation of Digital Filters Using a Modified Widrow-Hoff Algorithm for the Adaptive Cancellation of Acoustic Noise", L. A. Poole, G. E. Warnaka and R. C. Cutter, 1984, IEEE, CH 1945-5/84/00-00-0233, pp. 21.7.1–21.7.4, 1984.
"VLSI Systems Designed for Digital Signal Processing", Bowen and Brown, vol. 1, Prentice Hall, Englewood Cliffs, New Jersey, 1982, pp. 80–87.
"Comments on 'An Adaptive Recursive LMS Filter'", Widrow et al, Proceedings of the IEEE, vol. 65, No. 9, Sep. 1977, pp. 1402–1404, FIG. 2.
I.S.V.R. Technical Report No. 127, Elliot and Nelson, Southampton University, England, published in U.S. Department of Commerce; National Technical Information Service, Bulletin No. PB85-189777, Apr. 1984, pp. 1–61.
"An Analysis of Multiple Correlation Cancellation Loops With a Filter in the Auxiliary Path", Morgan, IEEE Transaction Acoustics Speech, Signal Processing, vol. ASSP-28, No. 4, 1980, pp. 454–467.
"Echo Cancellation Algorithms", Gritton and Lin, IEEE ASSP Magazine, Apr., 1984, pp. 30–38.
"Aspects of Network and System Theory", Widrow, Adaptive Filters, edited by R. E. Kalman and N. DeClaris, Holt, Reinhart and Winston, New York, 1971, pp. 563–587.
"Adaptive Control By Inverse Modeling", Widrow et al, Proceedings of 12th Asilomar Conference on Circuits, Systems and Computers, Pacific Grove, Calif., Nov. 6–8, 1978, pp. 90–94.

(List continued on next page.)

Primary Examiner—Forester W. Isen
Attorney, Agent, or Firm—Andrus, Sceales, Starke & Sawall

[57] ABSTRACT

An active acoustic attenuation system is provided that increases dynamic range by adjusting the amplitude of the input signal and the error signal at respective model and error inputs (42, 44) and providing automatic self-calibration. Input and error transducers (10, 16) provide analog input and error signals which are converted by an analog to digital converter (164, 170) to digital input and error signals for input to the model (40). Digital to analog converters (176) have digital inputs from respective digital input and error signals and operate in an analog to analog mode with analog inputs from respective input and error transducers (10, 16) and analog outputs to the analog to digital converter (164, 170). Dynamic range is also increased by adjusting the amplitude of the correction signal to the output transducer (14).

21 Claims, 10 Drawing Sheets

OTHER PUBLICATIONS

*Adaptive Signal Processing*, Windrow and Stearns, Englewood Cliffs, New Jersey, Prentice-Hall, Inc., 1985, pp. 196, 197, 222, 223.

*Number Theory in Science and Communications*, M. R. Schroeder, Berlin: Springer-Verlag, 1984, pp. 252-261.

"Adaptive Filters: Structures, Algorithms, and Applications", M. L. Honig, and D. G. Messerschmitt, The Kluwer International Series in Engineering and Computer Science, VLSI, Computer Architecture and Digital Signal Processing, 1984.

G.E. Intersil AD7523, 8-Bit Multiplying D/A Converter.

ACTIVE ATTENUATION SYSTEM WITH INCREASED DYNAMIC RANGE

BACKGROUND AND SUMMARY

The invention relates to active acoustic attenuation systems, and provides a system for cancelling undesirable output sound. The system provides increased dynamic range and simple user turn-on with automatic self-calibration.

The system adaptively models and compensates for feedback sound, and also provides adaptive on-line modeling and compensation of the effects of the error path and cancelling speaker.

Prior feedback cancellation systems use a filter to compensate for feedback sound from the speaker to the input microphone. It is desirable that this filter be adaptive in order to match the changing characteristics of the feedback path. Prior systems will successfully adapt only for broad band noise input signals because the system input is uncorrelated with the output of the feedback cancellation filter. Uncorrelated signals average to zero over time. However, if the input noise contains narrow band noise such as a tone having a regular periodic or recurring component, as at a given frequency, the filter output will be correlated with the system input and will not converge. The filter may thus be used adaptively only in systems having exclusively broad band input noise.

Most practical systems, however, do experience narrow band noise such as tones in the input noise. The noted filter cannot be adaptively used in such systems. To overcome this problem, and as is known in the prior art, the filter has been pre-trained off-line with broad band noise only. This pre-adapted filter is then fixed and inserted into the system as a fixed element which does not change or adapt thereafter.

A significant drawback of the noted fixed filter is that it cannot change to meet changing feedback path characteristics, such as temperature or flow changes in the feedback path, which in turn change the speed of sound. During the pre-training process, the filter models a pre-determined set of given parameters associated with the feedback path, such as length, etc. Once the parameters are chosen, and the filter is pre-adapted, the filter is then inserted in the system and does not change thereafter during operation. This type of fixed filter would be acceptable in those systems where feedback path characteristics do not change over time. However, in practical systems the feedback path does change over time, including temperature, flow, etc.

It is not practical to always be shutting down the system and re-training the filter every time the feedback path conditions change, nor may it even be feasible where such changes occur rapidly, i.e., by the time the system is shut down and the filter re-trained off-line, the changed feedback path characteristic such as temperature may have changed again. For this reason, the above-noted fixed filter is not acceptable in most practical systems.

There is thus a need for adaptive feedback cancellation in a practical active acoustic attenuation system, where the characteristics of the feedback path may change with time. A system is needed wherein the feedback is adaptively cancelled on-line for both broad band and narrow band noise without dedicated off-line pre-training, and wherein the cancellation further adapts on-line for changing feedback path characteristics such as temperature and so on.

Co-pending Ser. No. 777,928, filed Sept. 19, 1985, and assigned to the same assignee, discloses a system wherein the feedback is adaptively cancelled on-line for both broad band and narrow band noise without dedicated off-line pre-training, and wherein the cancellation further adapts on-line for changing feedback path characteristics such as temperature.

Co-pending application Ser. No. 777,825, filed Sept. 19, 1985 and assigned to the same assignee, discloses an improved system additionally providing adaptive on-line compensation of the error path between the cancelling speaker and the output. The characteristics of the cancelling speaker are assumed to be relatively constant or to change only slowly relative to the overall system and relative to the feedback path from the cancelling speaker to the input and relative to the error path from the cancelling speaker to the output. While the sound velocity in the feedback path and in the error path may change according to temperature, etc., the characteristics of the cancelling speaker change only very slowly relative thereto. The speaker is thus modeled off-line and calibrated, and assumed to be fixed or at least change only very slowly relative to the other system parameters, especially temperature and flow rate.

Co-pending application Ser. No. 828,454, filed Feb. 11, 1986 and assigned to the same assignee, provides a further improved system affording better performance, including adaptive on-line modeling of both the error path and the cancelling speaker, without dedicated off-line pre-training.

The noted co-pending applications provide a technique for active attenuation that effectively solves the problem of acoustic feedback from the secondary sound source cancelling speaker to the input microphone. This technique utilizes a recursive least mean squares RLMS algorithm to provide a complete pole-zero model of the acoustical plant. An error signal is used to adapt the coefficients of the RLMS algorithm model in such a manner as to minimize the residual noise.

If the speaker transfer function is not to be assumed fixed, or if a lower grade or quality speaker is desired for cost reduction, then both the error path transfer function and speaker transfer function must be compensated for in the algorithm model. Widrow, *Adaptive Filters*, "Aspects of Network and System Theory", R. E. Kalman and N. Declaris, EDS., New York, Holt, Rinehart and Winston, 1971, has shown that the LMS algorithm can be used with a delayed error signal if the input to the error correlators is also delayed. Similarly, Morgan, "Analysis of Multiple Correlation Cancellation Loop With a Filter in the Auxiliary Path", IEEE Transactions Acoustics, Speech, Signal Processing, Vol. ASSP-28 (4), pp. 454-467, 1980, has noted that the LMS algorithm can be used with a transfer function, such as that due to the speaker, in the auxiliary path if either this transfer function is also inserted in the input to the error correlators or if an inverse transfer function is added in series with the original. Burgess, "Active Adaptive Sound Control in a Duct: A Computer Simulation", Journal of Acoustic Society of America, 70 (3), pp. 715-726, 1981, has discussed similar results when both auxiliary path and error path transfer functions are present.

In an active sound attenuation system using the RLMS algorithm, if both the speaker transfer function S and the error path transfer function E are known, their effect on the convergence of the algorithm may be corrected through either the addition of S and E in the input lines to the error correlators or the addition of the inverse transfer functions $S^{-1}$ and $E^{-1}$ in series in the error path. Thus, it is necessary to obtain either direct or inverse models of S and E.

Poole et al, "The Implementation of Digital Filters Using a Modified Widrow-Hoff Algorithm for the Adaptive Cancellation of Acoustic Noise", Proceedings ICASSP 84, pp. 21.7.1–21.7.4, 1984, and Warnaka et al U.S. Pat. No. 4,473,906, have described a system using the LMS algorithm in which the delayed adaptive inverse modeling procedure of Widrow et al, "Adaptive Control by Inverse Modeling", Proceedings of 12th Asilomar Conference on Circuits, Systems and Computers, Pacific Grove, Calif., Nov. 6–8, 1978, pp. 90–94, is used to obtain an off-line model of the delayed inverse transfer function models $\Delta$ $S^{-1}E^{-1}$. As noted above, this approach then requires the addition of delay $\Delta$ to the input to the error correlators of the LMS algorithm. The above noted co-pending application Ser. No. 777,825, filed Sept. 19, 1985, describes a three microphone system using the RLMS algorithm in which the error plant is modeled on-line using either a direct or inverse model while the speaker is modeled off-line.

In the noted co-pending application Ser. No. 828,454, the speaker and the error path are modeled on-line. The system functions adaptively in the presence of acoustic feedback, and non-ideal speaker and error path transfer functions. The system responds automatically to changes in the input signal, acoustic plant, error plant and speaker characteristics.

There are two basic techniques available for use in system modeling. The direct model approach places the adaptive model in parallel with the speaker. The impulse response of the model is the same as that of the speaker. The inverse model approach places the adaptive model in series with the speaker. The impulse response of the model represents the delayed inverse response of the speaker. Either approach can be used off-line to determine SE or $\Delta$ $S^{-1}E^{-1}$ for use in the RLMS algorithm as noted above. However, on-line measurements are complicated by the fact that in addition to the model output exciting the speaker S, the plant output is also present at the input to the error path E. The speaker transfer function cannot be determined in this case unless the plant noise, which is correlated with the model output, is removed. The model output or a training signal can be used to determine SE off-line.

The noted application Ser. No. 828,454 provides a technique and system for on-line modeling of S and E. An uncorrelated auxiliary random noise source is used to excite the speaker and the error path. The noise level emanating from the speaker will ultimately become the residual noise of the system. A direct adaptive model is used to obtain coefficients describing S and E that can be used in the input lines to the error correlators for the primary RLMS algorithm in the preferred embodiment. The amplitude of the auxiliary uncorrelated noise source is kept very low so that the final effect on the residual noise is small. The plant output noise and the model output are not present at the input to the adaptive SE model and so will not affect the final values of the model weights. The auxiliary noise source is placed following the summing junction of the RLMS algorithm and ensures that the added noise passes through both the electro-acoustic feedback path as well as the recursive loop in the RLMS algorithm and the feedback noise is cancelled as the algorithm converges.

The uncorrelated random auxiliary noise source is independent of the input signal and ensures that the speaker and error path will be correctly modeled. The signals from the plant output and the model represent noise on the plant side of the speaker/error path modeling system and will not affect the weights of the direct LMS model used to determine SE. Copies of this model are provided in the input lines of the error correlators.

It is noted in application Ser. No. 828,454 that the use of a delayed adaptive inverse model $\Delta$ $S^{-1}E^{-1}$ will result in decreased performance since the plant noise due to the plant output and model output also appears at the input to the adaptive filter. Thus, the auto-correlation function of the filter input is adversely affected, and the filter weights are modified, Widrow and Stearns, *Adaptive Signal Processing*, Englewood Cliffs, N.J., Prentice-Hall, Inc., 1985, pp. 196, 197, 222, 223. If the plant noise is large enough, the adaptive model may fail to converge. Thus, the delayed adaptive inverse approach requires a much larger amplitude noise source, which increases the residual noise and decreases overall system quieting.

In a direct model system, SE, the plant noise does not affect the final weights in the adaptive model. In addition, the convergence of the SE model is assured as long as the initial amplitudes are within the dynamic range of the system. Thus, with SE acccurately determined, the overall system model will converge, resulting in minimum residual noise. The algorithm properly converges for either narrow band or broad band input signals. The coefficients of the SE model properly describe the SE path, and the coefficients of the overall system model properly describe the plant P, the feedback path F, the error path E, and the speaker S. Ser. No. 828,454 discloses an active attenuation system in which acoustic feedback is modeled as part of the adaptive filter, and in which the effects of the sound source and the error path transfer functions are adaptively modeled on-line through the use of a second algorithm that uses a separate low level random auxiliary noise source to model the sound source and error path which the system is operating.

The present invention provides a further improved system which is particularly user friendly and increases dynamic range without manual tuning or calibration either before or during operation. The adaptive filter model has certain levels of signals at which it operates best. For example, in a very low amplitude noise environment, it may be desirable to amplify the input signal to the model from the input microphone in order to bring such signal into a desired range for operation of the model. In higher noise environments, lower levels of amplification or no amplification may be desired. Rather than testing the system for the particular environment in which it is to be used, and then pre-setting various limits, it is more desirable from the user standpoint to merely turn on the system and let it run. The present invention addresses and solves this need by automatically calibrating the model inputs. This further desirably increases the dynamic range of the system because the model will be operating on a desired range of signal levels, not at levels on either end of its operational spectrum.

DETAILED DESCRIPTION

Figure 1:
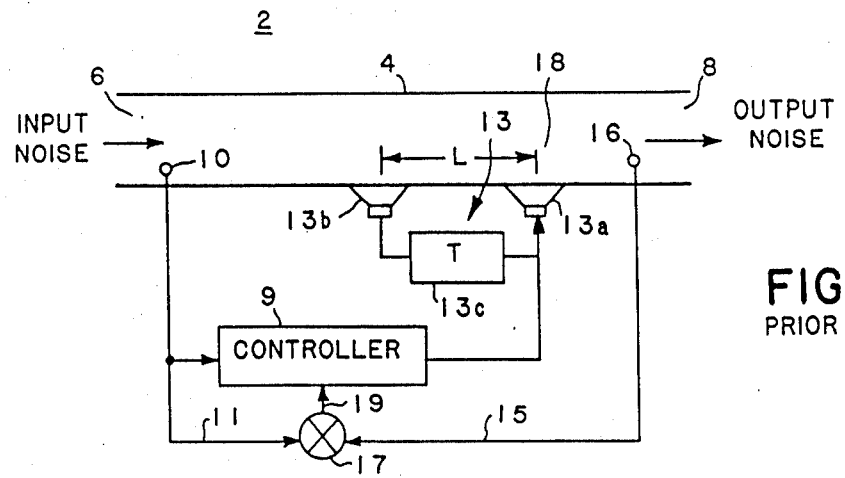
FIG. 1 is a schematic illustration of an active acoustic attenuation system known in the prior art.
Figure 2:
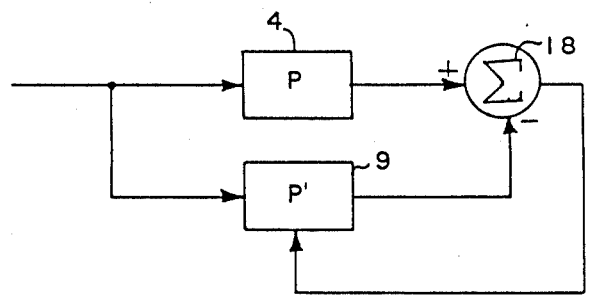
FIG. 2 is a block diagram of the embodiment in FIG. 1.

FIG. 1 shows a known prior art acoustic system 2 including a propagation path or environment such as a duct or plant 4 having an input 6 for receiving input noise and an output 8 for radiating or outputting output noise. The input noise is sensed with an input microphone 10 and an input signal is sent to controller 9 which drives unidirectional speaker array 13 which in turn injects cancelling sound into duct or plant 4 which sound is optimally equal in amplitude and opposite in sign to the input noise to thus cancel same. The combined noise is sensed with an output microphone 16 which provides an error signal fed to controller 9 which then outputs a correction signal to speaker array 13 to adjust the cancelling sound. The error signal at 15 is typically multiplied with the input signal at 11 by multiplier 17 and the result provided as weight update signal 19, for example as discussed in Gritton and Lin "Echo Cancellation Algorithms", IEEE ASSP Magazine, April 1984, pp. 30-38. In some prior art references, multiplier 17 is explictly shown, and in others the multiplier 17 or other combination of signals 11 and 15 is inherent or implied in controller 9 and hence multiplier or combiner 17 may be deleted in various references, and such is noted for clarity. For example, FIG. 2 shows the deletion of such multiplier or combiner 17, and such function, if necessary, may be implied in controller 9, as is understood in the art.

Speaker array 13 is unidirectional and emits sound only to the right in FIG. 1, and does not emit sound leftwardly back to microphone 10, thus preventing feedback noise. The particular type of unidirectional speaker array shown is a Swinbanks type having a pair of speakers 13a and 13b separated by a distance L. The input to speaker 13b is an inverted version of the input to speaker 13a that has been delayed by a time $\tau = L/c$ where c is the speed of sound. This arrangement eliminates acoustic feedback to microphone 10 over a limited frequency range. The time delay must be adjusted to account for changes in sound speed due to temperature variations. Other types of unidirectional speakers and arrays are also used, for example as shown in "Historical Review and Recent Development of Active Attenuators", H. G. Leventhall, Acoustical Society of America, 104th Meeting, Orlando, Nov., 1982, FIG. 8. In another system, a unidirectional microphone or an array of microphones is used at 10, to ignore feedback noise. Other methods for eliminating the feedback problem are also used, such as a tachometer sensing rotational speed, if a rotary source provides the input noise, and then introducing cancelling sound according to sensed RPM, without the use of a microphone sensing input noise at 10. Other systems employ electrical analog feedback to cancel feedback sound. Others employ a fixed delay to cancel known delayed feedback sound.

Acoustic system 4 is modeled by controller model 9 having a model input from input microphone 10 and an error input from output microphone 16, and outputting a correction signal to speaker array 13 to introduce cancelling sound such that the error signal approaches a given value, such as zero. FIG. 2 shows the modeling, with acoustic system 4 shown at the duct or plant P, the modeling controller 9 shown at P', and the summation thereof shown at 18 at the output of speaker array 13 where the sound waves mix. The output of P is supplied to the plus input of summer 18, and the output of P' is supplied to the minus input of summer 18. Model 9, which may use the least means square (LMS) algorithm, adaptively cancels undesirable noise, as is known, and for which further reference may be had to "Active Adaptive Sound Control in a Duct: A Computer Simulation", J. C. Burgess, Journal of Acoustic Society of America, 70(3), Sept., 1981, pp. 715-726, to Warnaka et al U.S. Pat. No. 4,473,906, and to Widrow, Adaptive Filters, "Aspects of Network and System Theory", edited by R. E. Kalman and N. DeClaris, Holt, Reinhart and Winston, New York, 1971, pp. 563-587. The system of FIGS. 1 and 2 operates properly when there is no feedback noise from speaker array 13 to input microphone 10.

Figure 3:
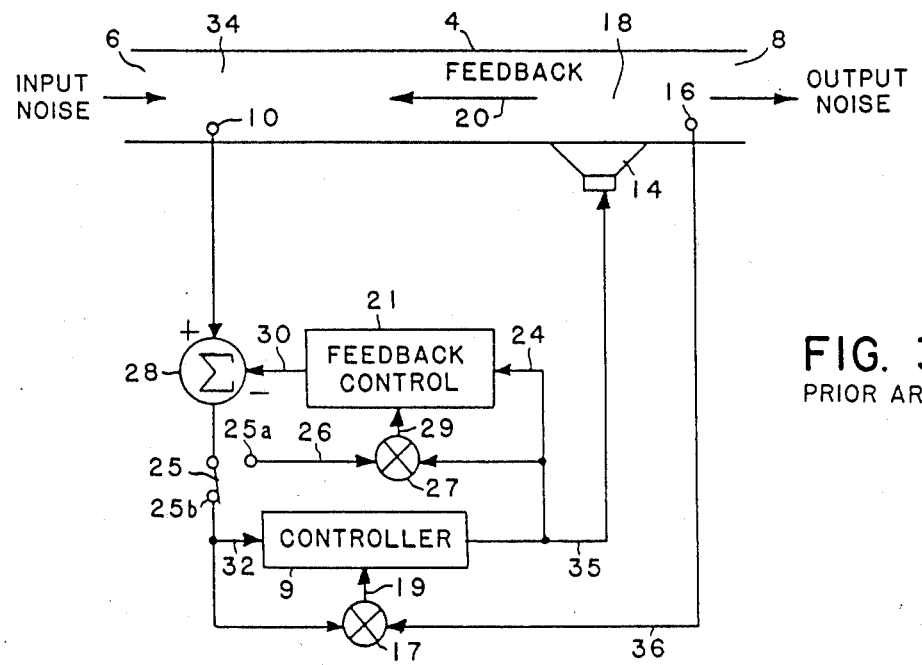
FIG. 3 is a schematic illustration of a feedback cancellation active acoustic attenuation system known in the prior art.

It is also known to provide an omnidirectional speaker 14, FIG. 3, for introducing the cancelling sound, and to provide means for compensating feedback therefrom to the input microphone. As seen in FIG. 3, the cancelling sound introduced from omnidirectional speaker 14 not only mixes with the output noise to cancel same, but also travels leftwardly and is sensed at input microphone 10 along feedback path 20, as shown in FIG. 3 where like reference numerals are used from FIG. 1 where appropriate to facilitate clarity. In one known system for cancelling feedback, as shown in Davidson Jr. et al U.S. Pat. No. 4,025,724, the length of the feedback path is measured and then a filter is set accordingly to have a fixed delay for cancelling such delayed feedback noise. In another known system for cancelling feedback, a dedicated feedback control 21 in the form of a filter is provided, for example as shown in "Active Noise Reduction Systems in Ducts", Tichy et al, ASME Journal, November, 1984, page 4, FIG. 7, and labeled "adaptive uncoupling filter". Feedback control filter 21 is also shown in the above noted Warnaka et al U.S. Pat. No. 4,473,906 as "adaptive uncoupling filter 75" in FIGS. 14 and 15, and in "The Implentation of Digital Filters Using a Modified Widrow-Hoff Algorithm For the Adaptive Cancellation of Acoustic Noise", Poole et al, 1984 IEEE, CH 1945-5/84/0000-0233, pp. 21.7.1-21.7.4. Feedback control filter 21 typically has an error signal at 26 multiplied with the input signal at 24 by multiplier 27 and the result provided as weight update signal 29. Feedback control or adaptive uncoupling filter 21 is pre-trained off-line with a dedicated set of parameters associated with the feedback path. The filter is pretrained with broad band noise before the system is up and running, and such predetermined dedicated fixed filter is then inserted into the system.

In operation in FIG. 3, controller 9 is a least mean square (LMS) adaptive filter which senses the input from microphone 10 and outputs a correction signal to speaker 14 in an attempt to drive the error signal from microphone 16 to zero, i.e., controller 9 continually adaptively changes the output correction signal to speaker 14 until its error input signal from microphone 16 is minimized. Feedback control filter 21 has an input at 24 from the output of controller 9.

During off-line pre-training, switch 25 is used to provide filter 21 with an error input at 26 from summer 28. During the off-line pre-training, switch 25 is in its upward position to contact terminal 25a. During this pre-training, broad band noise is input at 35, and feedback control 21 changes its output 30 until its error input at 26 is minimized. The output 30 is summed at 28 with the input from microphone 10, and the result is fed to controller 21. Feedback control 21 is pre-trained off-line to model feedback path 20, and to introduce a cancelling component therefor at 30 to summer 28 to remove such feedback component from the input to controller 9 at 32. LMS adaptive filter 21 is typically a transversal filter and once its weighting coefficients are determined during the pre-training process, such coefficients are kept fixed thereafter when the system is up and running in normal operation.

After the pre-training process, switch 25 is used to provide an input to controller 9, and the weighting coefficients are kept constant. After the pre-training process and during normal operation, switch 25 is in its downward position to contact terminal 25b. The system is then ready for operation, for receiving input noise at 6. During operation, feedback control 21 receives no error signal at 26 and is no longer adaptive, but instead is a fixed filter which cancels feedback noise in a fixed manner. The system continues to work even if narrow band noise such as a tone is received at input 6. However, there is no adaptation of the filter 21 to changes in the feedback path due to temperature variations and so on.

Figure 4:
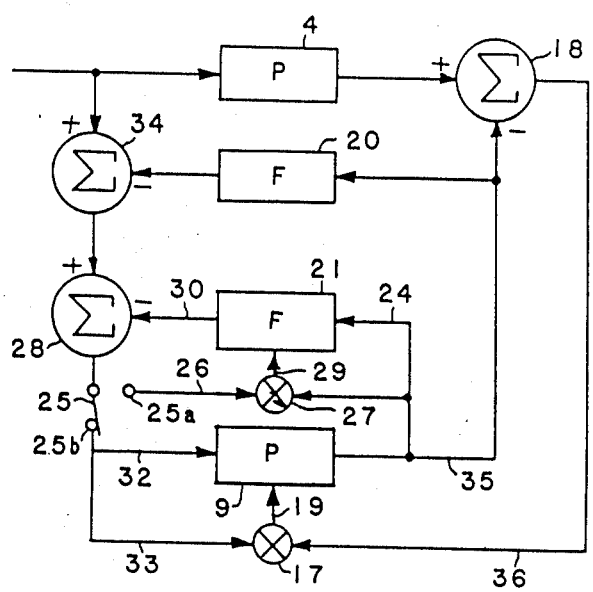
FIG. 4 is a block diagram of the embodiment in FIG. 3.

FIG. 4 shows the system of FIG. 3 with feedback path 20 summed at 34 with the input noise adjacent microphone 10. Fixed feedback control cancellation filter 21 is shown at F', and adaptive controller 9 at P'. Adaptive controller 9 at P' models the duct or plant 4 and senses the input at 32 and outputs a correction signal at 35 and varies such correction signal until the error signal at 36 from summer 18 approaches zero, i.e., until the combined noise at microphone 16 is minimized. Fixed filter 21 at F' models the feedback path 20 and removes or uncouples the feedback component at summer 28 from the input 32 to filter 9. This prevents the feedback component from speaker 14 from being coupled back into the input of the system model P'. As above noted, the error signal at 26 is only used during the training process prior to actual system operation.

It is also known that propagation delay between speaker 14 and microphone 16 if any, may be compensated by incorporating a delay element in input line 33 to compensate for the inherently delayed error signal on line 36.

Feedback model F' at filter 21 will successfully adapt for broad band noise because the system input is uncorrelated with the output of the feedback cancellation filter. Filter 21 may thus model the predetermined feedback path according to the preset feedback path characteristic. However, if the input noise contains any narrow band noise such as a tone having a regular periodic or recurring component, as at a given frequency, the output of filter 21 will be correlated with the system input and will continue to adapt and not converge. Filter 21 may thus be used adaptively only in systems having exclusively broad band input noise. Such filter is not amenable to systems where the input noise may include any narrow band noise.

Most practical systems do have narrow band noise in the input noise. Thus, in practice, filter 21 is pre-adapted and fixed to a given set of predetermined feedback path characteristics, and does not change or adapt to differing feedback path conditions over time, such as temperature, flow rate, and the like, which affect sound velocity. It is not practical to always be retraining the filter every time the feedback path conditions change, nor may it even be feasible where such changes occur rapidly, i.e., by the time the system is shut down and the filter retrained off-line, the changed feedback path characteristic such as temperature may have changed again.

Thus, the feedback control system of FIGS. 3 and 4 is not adaptive during normal operation of the system. Filter 21 must be pre-trained off-line with broad band noise and then fixed, or can only be used adaptively on-line with broad band noise input. These conditions are not practical.

There is a need for truly adaptive feedback cancellation in an active attenuation system, wherein the feedback is adaptively cancelled on-line for both broad band and narrow band noise without dedicated off-line pre-training, and wherein the cancellation further adapts on-line for changing feedback path characteristics such as temperature and the like.

Figure 5:
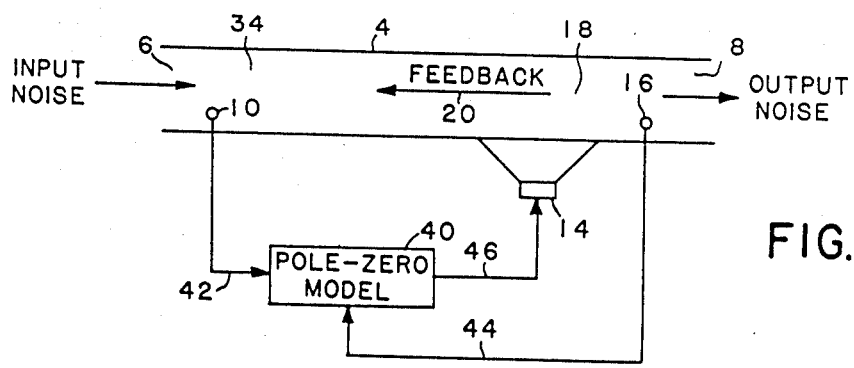
FIG. 5 is a schematic illustration of acoustic system modeling in accordance with the noted co-pending Application Ser. No. 777,928, filed Sept. 19, 1985.

FIG. 5 shows a modeling system in accordance with the above noted co-pending Application Ser. No. 777,928, filed Sept. 19, 1985, and like reference numerals are used from FIGS. 1-4 where appropriate to facilitate clarity. Acoustic system 4, such as a duct or plant, is modeled with an adaptive filter model 40 having a model input 42 from input microphone or transducer 10 and an error input 44 from output microphone or transducer 16, and outputting a correction signal at 46 to omnidirectional speaker or transducer 14 to introduce cancelling sound or acoustic waves such that the error signal at 44 approaches a given value such as zero. In FIG. 5, sound from speaker 14 is permitted to travel back along feedback path 20 to input microphone 10 comparably to FIG. 3, and unlike FIG. 1 where such feedback propagation is prevented by unidirectional speaker array 13. The use of an omnidirectional speaker is desirable because of its availability and simplicity, and because it eliminates the need to fabricate a system of speakers or other components approximating a unidirectional arrangement.

In accordance with the above noted co-pending applications, feedback path 20 from transducer 14 to input microphone 10 is modeled with the same model 40 such that model 40 adaptively models both acoustic system 4 and feedback path 20. It does not use separate on-line modeling of acoustic system 4 and off-line modeling of feedback path 20. In particular, off-line modeling of the feedback path 20 using broad band noise to pre-train a separate dedicated feedback filter is not necessary. Thus, in the prior art of FIG. 4, the feedback path F at 20 is modeled separately from the direct path 4 at plant P, with a separate model 21 at F' pre-trained solely to the feedback path and dedicated thereto as above noted. In the above noted copending applications, the feedback path is part of the model 40 used for adaptively modeling the system.

Figure 6:
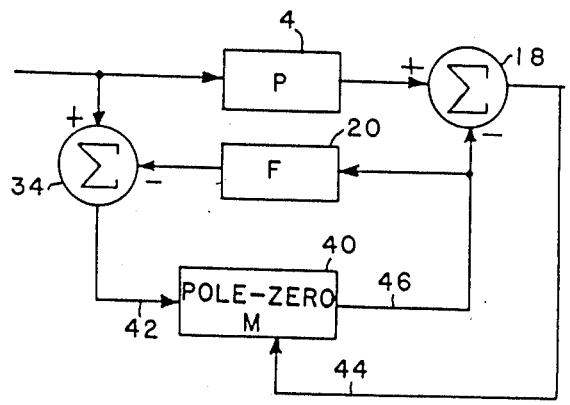
FIG. 6 is a block diagram of the system in FIG. 5.

FIG. 6 shows the system of FIG. 5, wherein acoustic system 4 and feedback path 20 are modeled with a single filter model 40 having a transfer function with poles used to model feedback path 20. This is a significant advance over the art because it recognizes that individual finite impulse response (FIR) filters shown in FIGS. 3 and 4 are not adequate to truly adaptively cancel direct and feedback noise. Instead, a single infinite impulse response (IIR) filter is needed to provide truly adaptive cancellation of the direct noise and acoustic feedback. In accordance with the above noted co-pending applications and in the present invention, the acoustic system and the feedback path are modeled on-line with an adaptive recursive filter model. Since the model is recursive, it provides the IIR characteristic present in the acoustic feedback loop wherein an impulse will continually feed upon itself in feedback manner to provide an infinite response.

As noted in the above referenced Warnaka et al U.S. Pat. No. 4,473,906, column 16, lines 8+, the adaptive cancelling filter in prior systems is implemented by a transversal filter which is a non-recursive finite impulse response filter. These types of filters are often referred to as all-zero filters since they employ transfer functions whose only roots are zeros, "VLSI Systems Designed for Digital Signal Processing", Bowen and Brown, Vol. 1, Prentice Hall, Englewood Cliffs, N.J., 1982, pp. 80-87. To adaptively model acoustic system 4 and feedback path 20 with a single filter model 40 requires a filter with a transfer function containing both zeros and poles. Such poles and zeros are provided by a recursive IIR algorithm. The above noted co-pending applications and the present invention involve providing an IIR recursive filter model to adaptively model acoustic system 4 and feedback path 20. This problem has been discussed by Elliot and Nelson in I.S.V.R. Technical Report No. 127, Southampton University, England, published in U.S. Department of Commerce, National Technical Information Service, Bulletin No. PB85-189777, April 1984. In discussing the use of recursive models for use in active attenuation systems, Elliot et al note, page 37, that the number of coefficients used to implement the direct and feedback modeling can desirably be kept to a minimum, however they further note that there is "no obvious method" to use in obtaining the responses of the recursive structure. In the conclusion on page 54, last paragraph, Elliot et al note that "no procedure has yet been developed for adapting the coefficients of a recursive IIR filter to obtain the best attenuation". The above noted copending applications and the present invention provide a system that solves this problem and adaptively determines these coefficients in a practical system that is effective on broad band as well as narrow band noise.

The poles of the transfer function of the model 40 result in a recursive characteristic that is necessary to simultaneously model the acoustic system 4 and the feedback path 20. The response of model 40 will feedback upon itself and can be used to adaptively cancel the response of the feedback path 20 which will also feedback upon itself. In contrast, in an FIR filter, there is no feedback loop but only a direct path through the system and only zeros are possible, as in the above noted Tichy et al article and Warnaka et al patent, i.e., the zeros of the numerator of the transfer function. Thus, two individual models must be used to model the acoustic system 4 and feedback path 20.

For example, in Tichy et al and Warnaka et al, two independent models are used. The feedback path is modeled ahead of time by pre-training the feedback filter model off-line. In contrast, in the above noted co-pending applications and in the present invention, the single model adapts for feedback on-line while the system is running, without pre-training. This is significant because it is often impossible or not economically feasible to retrain for feedback every time the feedback path characteristics change, e.g., with changing temperature, flow rate, etc. This is further significant because it is not known when narrow band noise such as a tone may be included in the input noise, and must be adaptively accommodated and compensated for.

Figure 7:
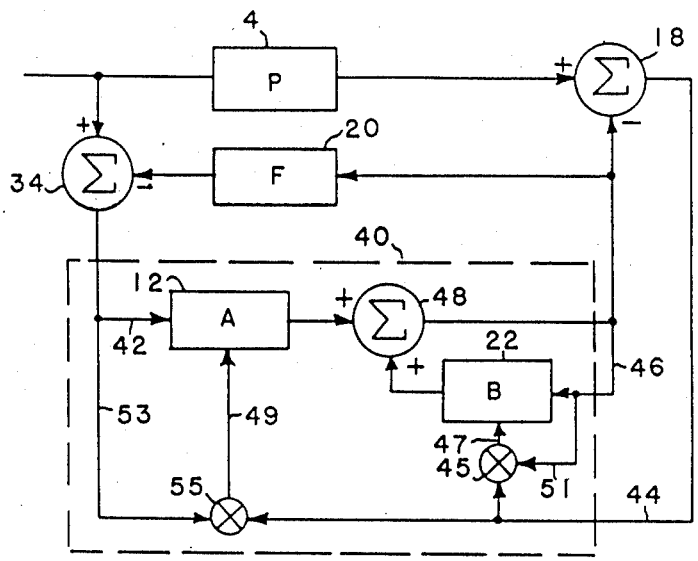
FIG. 7 is one embodiment of the system in FIG. 6.

FIG. 7 shows one form of the system of FIG. 6. The feedback element B at 22 is adapted by using the error signal at 44 as one input to model 40, and the correction signal at 46 as another input to model 40, together with the input at 42. The direct element A at 12 has an output summed at 48 with the output of the feedback element B at 22 to yield the correction signal at 46 to speaker or transducer 14 and hence summer 18.

Figure 8:
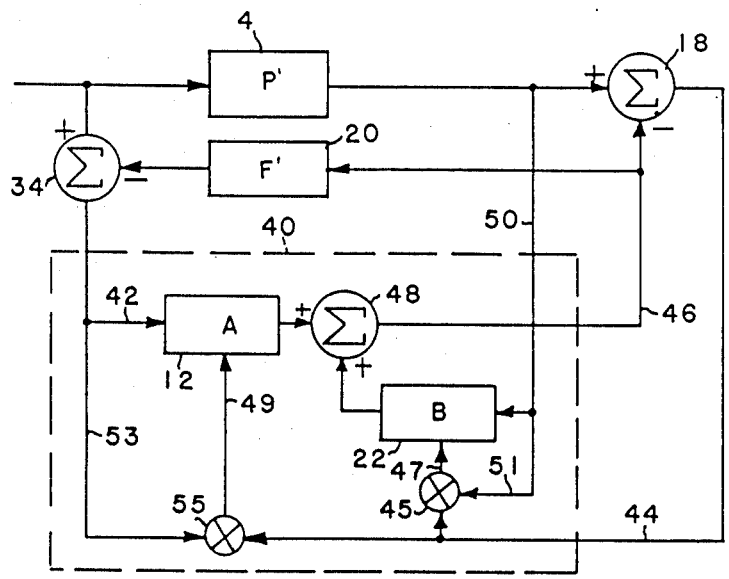
FIG. 8 is another embodiment of the system in FIG. 6.
Figure 9:
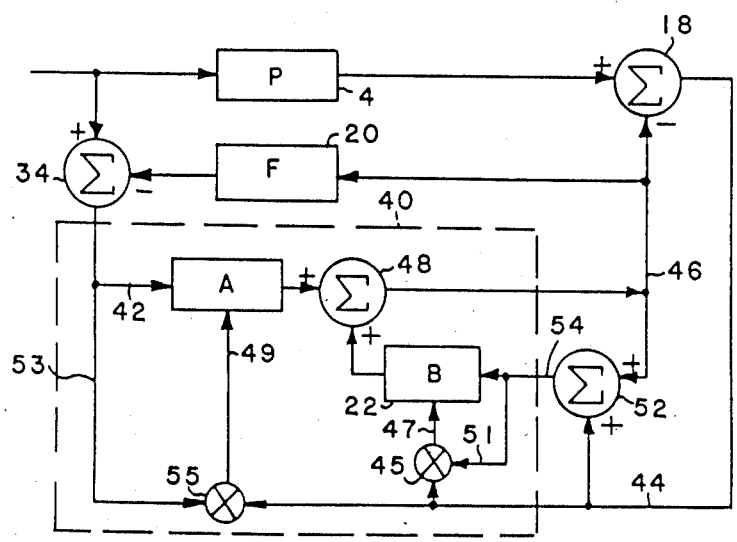
FIG. 9 is a further embodiment of the system in FIG. 6.

In FIG. 8, the input to feedback element B at 22 is provided by the output noise at 50 instead of the correction signal at 46. This is theoretically desirable since the correction signal at 46 tends to become equal to the output noise at 50 as the model adapts. Improved performance is thus possible through the use of the output noise 50 as the input to the feedback element B from the beginning of operation. However, it is difficult to measure the output noise without the interaction of the cancelling sound from speaker 14. FIG. 9 shows a particularly desirable implementation enabling the desired modeling without the noted measurement problem. In FIG. 8, the feedback element is adapted at B using the error signal at 44 from the output microphone as one input to model 40, and the output noise at 50 as another input to model 40. In FIG. 9, the error signal at 44 is summed at summer 52 with the correction signal at 46, and the result is provided as another inout at 54 to model 40. This input 54 is equal to the input 50 shown in FIG. 8, however it has been obtained without the impractical acoustical measurement required in FIG. 8. In FIGS. 7-9, one of the inputs to model 40 and to feedback element B component 22 is supplied by the overall system output error signal at 44 from output microphone 16. The error signal at 44 is suoplied to feedback element B through multiplier 45 and multiplied with input 51, yielding weight update 47. Input 51 is provided by correction signal 46, FIG. 7, or by noise 50, FIG. 8, or by sum 54, FIG. 9.; The error signal at 44 is supplied to direct element A through multiplier 55 and multiplied with input 53 from 42, yielding weight update 49.

Figure 10:
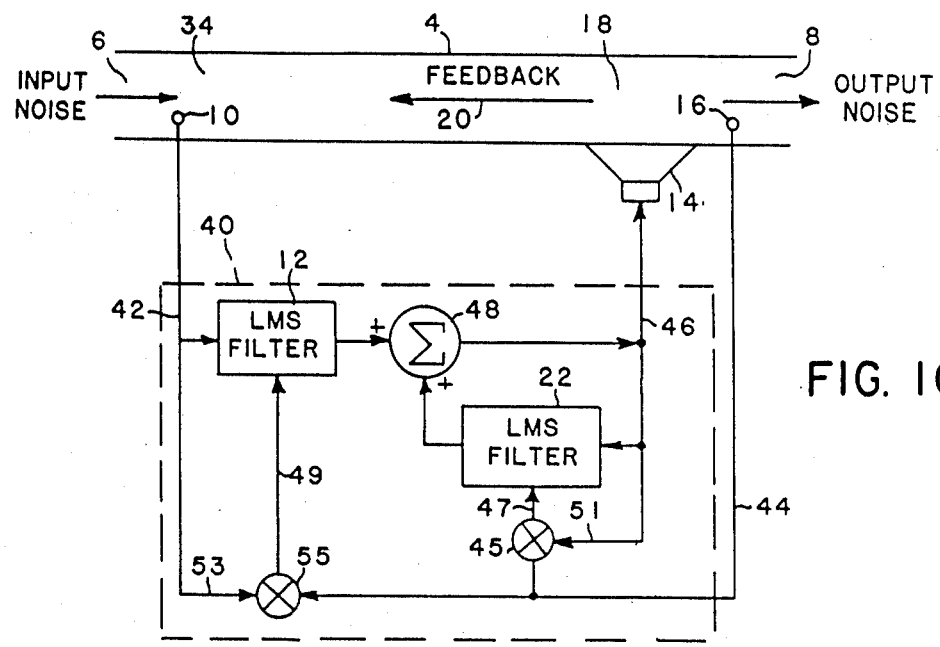
FIG. 10 is a schematic illustration of the system in FIG. 7.

The above noted co-pending applications enable in their preferred embodiments the use of a recursive least mean square (RLMS) algorithm filter, for example "Comments on 'An Adaptive Recursive LMS Filter'", Widrow et al, Proceedings of the IEEE, Vol. 65, No. 9, September 1977, pp. 1402-1404, FIG. 2. The above noted co-pending applications and the present invention are particularly desirable in that they enable the use of this known recursive LMS algorithm filter. As shown in FIG. 10, illustrating the system of FIG. 7, the direct element A at 12 may be modeled by an LMS filter, and the feedback element B at 22 may be modeled with an LMS filter. The adaptive recursive filter model 40 shown in the embodiment of FIG. 10 is known as the recursive least mean square (RLMS) algorithm.

Figure 11:
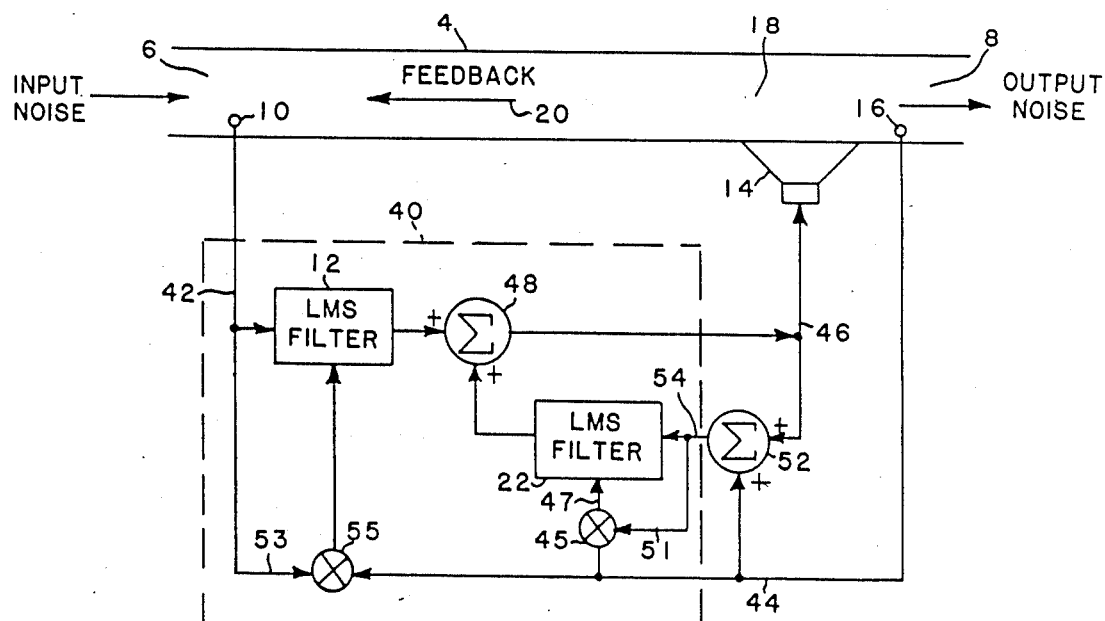
FIG. 11 is a schematic illustration of the system in FIG. 9.

In FIG. 11, showing the system in FIG. 9, the feedback path 20 is modeled using the error signal at as one input to model 40, and summing the error signal at 44 with the correction signal at 46, at summer 52, and using the result at 54 as another input to model 40.

The delay, if any, in output 8 between speaker 14 and microphone 16, may be compensated for by a comparable delay at the input 51 to LMS filter 22 and/or at the input 53 to LMS filter 12.

The above noted co-pending applications and the present invention model the acoustic system and the feedback path with an adaptive filter model having a transfer function with poles used to model the feedback path It is of course within the scope of the invention to use the poles to model other elements of the acoustic system in combination with modeling the feedback path. It is also within the scope of the invention to model the feedback path using other characteristics, such as zeros, in combination with the poles.

It is well known that the LMS algorithm may be used in applications where the error is delayed, as long as the input signal used in the weight update signal is delayed by the same amount, as described in the above noted Widrow, *Adaptive Filters* reference. Similarly, the importance of compensating for the presence of a transfer function, that could be associated with the speaker 14, in the auxiliary path of the LMS algoirthm by either adding an inverse transfer function in series with the original or by inserting the original transfer function in the path of the input signal used in the weight update signal has been discussed, Morgan, "An Analysis of Multiple Correlation Cancellation Loops With a Filter in the Auxiliary Path", IEEE Transactions Acoustics Speech, Signal Processing, Vol. ASSP-28, No. 4, pp. 454-467, 1980. However, adaptive modeling of the delay or transfer function for the error path has not been accomplished in the prior art before the above noted co-pending applications, nor has compensation for the error path and speaker transfer functions been accomplished in an adaptive IIR model such as the RLMS algorithm.

Figure 12:
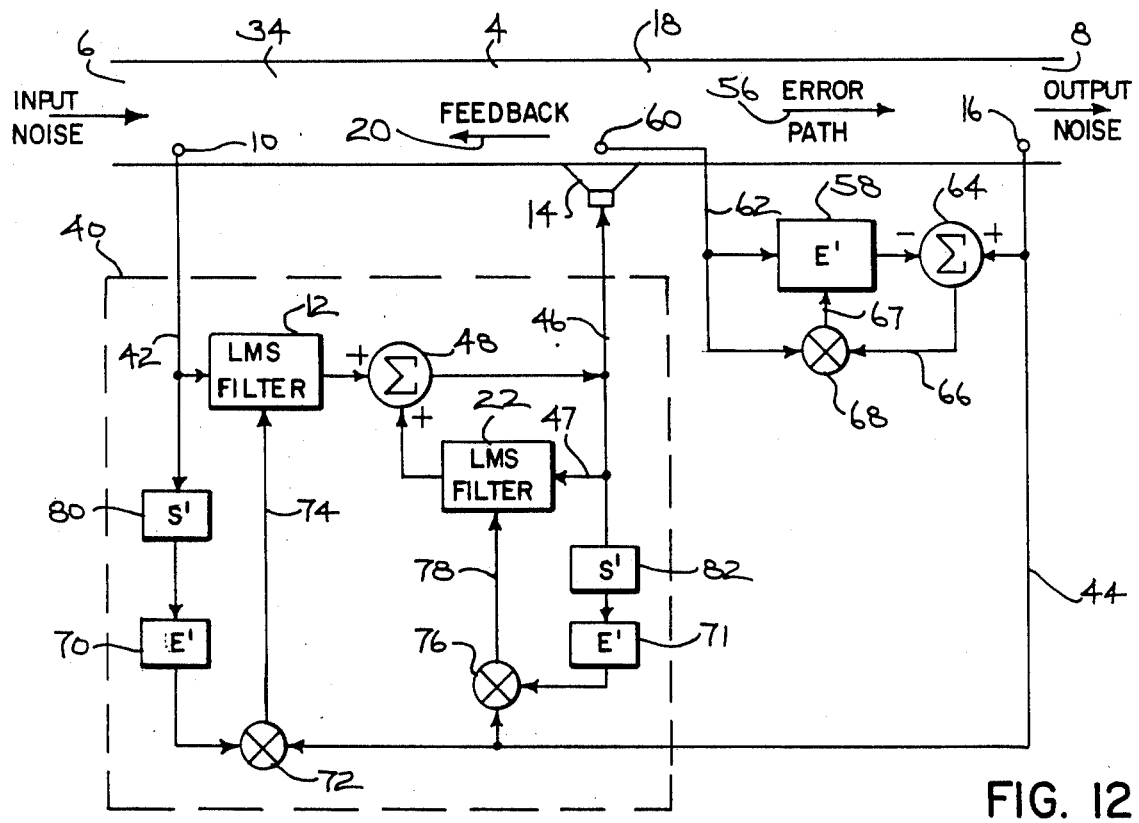
FIG. 12 is a block diagram of a system for acoustic modeling in accordance with the noted copending Application Ser. No. 777,825, filed Sept. 19, 1985.

FIG. 12 shows a system in accordance with the above noted co-pending application Ser. No. 777,825, filed Sept. 19, 1985, for adaptively cancelling feedback to the input from output transducer or speaker 14 for both broad band and narrow band noise or acoustic waves on-line without off-line pre-training, and for providing adaptive error path compensation, and providing compensation of output transducer or speaker 14. The combined output sound from input 6 and speaker 14 at output 8 is sensed by output microphone or error transducer 16 spaced from speaker 14 along an error path 56. The acoustic system is modeled with the adaptive filter model 40 provided by filters 12 and 22 having a model input at 42 from input microphone or transducer 10 and an error input at 44 from error microphone or transducer 16. Model 40 outputs a correction signal at 46 to output speaker or transducer 14 to introduce cancelling sound such that the error signal at 44 approaches a given value. Feedback path 20 from speaker 14 to input microphone 10 is modeled with the same model 40 by modeling feedback path 20 as part of the model 40 such that the latter adaptively models both the acoustic system and the feedback path, without separate modeling of the acoustic system and the feedback path, and without a separate model pretrained off-line solely to the feedback path with broad band noise and fixed thereto.

Error path 56 is modeled with a second adaptive filter model 58 shown at E' and a copy of the adaptive error path model E' is provided in the first model 40 afforded by filters 12 and 22 such that the first model can successfully model the acoustic system and feedback path. A second error microphone or transducer 60 is provided at the input to error path 56 adjacent speaker 14. Adaptive filter model 58 has a model input at 62 from second error microphone 60. The outputs of error path 56 and model 58 are summed at summer 64 and the result is used as an error input at 66 to model 58. The error siqnal at 66 is multiplied with the input 62 at multiplier 68 and input to model 58 at weiqht update siqnal 67.

Adaptive model 40 is provided by alqorithm filters 12 and 22 each having an error input at 44 from error microphone 16. The outputs of the first and second algorithm filters are summed at 48 and the result is used as the correction signal at 46 to speaker 14. A copy of the adaptive error path model 58 at E' is provided in each of algorithm filters 12 and 22 at 70 and 71, respectively. An input at 42 to algorithm filter 12 is provided from input microphone 10. Input 42 also provides an input to adaptive error path model copy 70 through speaker model copy 80, to be described. The output of copy 70 is multiplied at multiplier 72 with the error signal at 44 and the result provided as weight update signal 74 to algorithm filter 12. The correction signal at 46 provides an input 47 to algorithm filter 22 and also provides an input to adaptive error path model copy 71 through speaker model copy 82, to be described. The output of copy 71 and the error signal at 44 are multiplied at 76 and the result provided as weight update signal 78 to algorithm filter 22. In an alternative, as shown in FIG. 9, the correction signal at 46 may be summed with the error signal at 44 at a summer such as 52, FIG. 9, and the result at 54 is used as the input 47 to algorithm filter 22 and to copied speaker model 82 and error path model 71.

Figure 13:
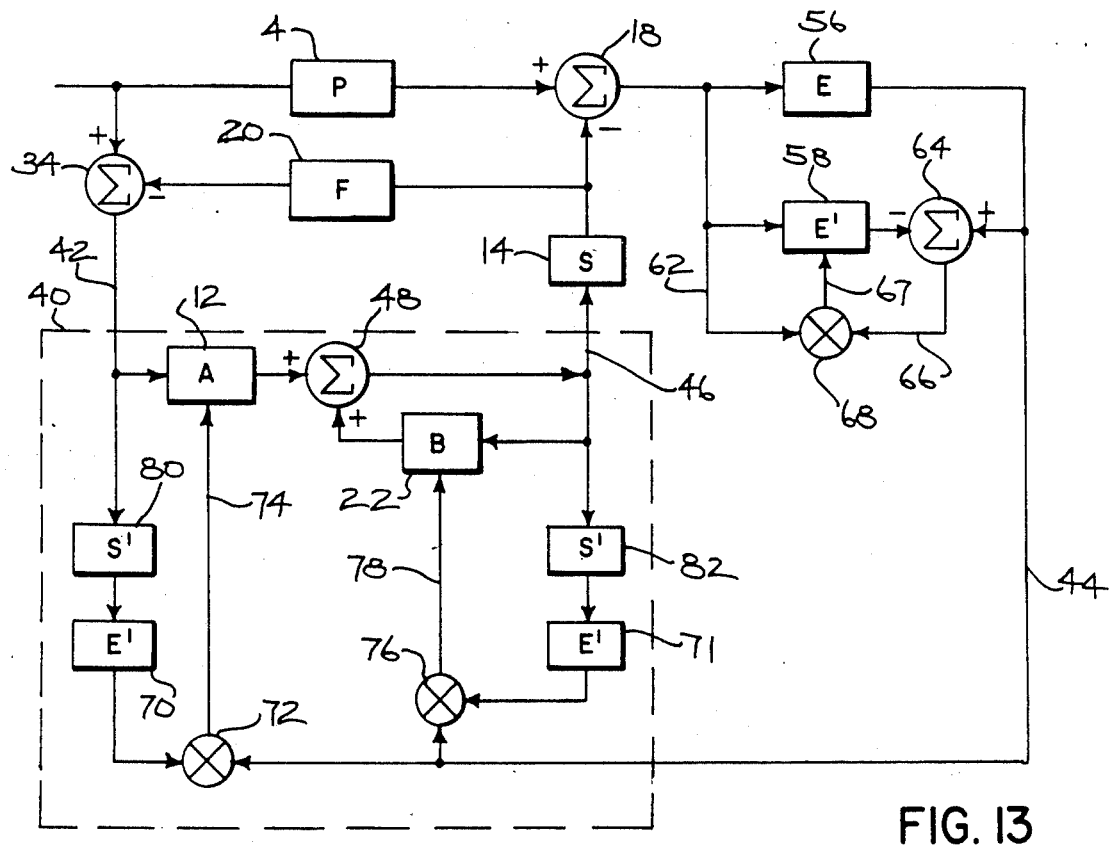
FIG. 13 is a schematic illustration of the system in FIG. 12.

In FIG. 13, the error path or plant between loudspeaker 14 and the first error microphone 16, FIG. 12, is directly modeled on-line, and a copy of the error path model E' is provided in the system model 40. The copying of a model and the provision of such copy in another part of the system is known, for example the above noted Morgan reference. The second error microphone 60, FIG. 12, enables adaptive modeling of error path 56 via error path model E' at 58. In prior art systems, such as the above noted Warnaka patent, the problem was addressed by turning off the source and using a training signal through speaker 14 and error path 56, and then modeling the error path with an error path model that is fixed and not adaptive during operation of the complete system. The problem with such an approach is that the error path 56 changes with time, for example as temperature or flow rate changes, and hence the system suffers the above noted disadvantages because it is impractical to always be re-training the system model everytime the error path conditions change.

As noted in the above noted co-pending applications, there is a need for an adaptive system wherein the error path is adaptively modeled and compensated on-line without dedicated off-line pretraining and wherein such compensation further adapts on-line for changing error path characteristics such as temperature and so on.

The system in FIGS. 12 and 13 also compensates for output speaker or transducer 14. The characteristics of speaker 14 are assumed to change slowly relative to the overall system and to feedback path 20 and to error path 56. While the sound velocity in feedback path 20 and error path 56 may change according to temperature etc., the characteristics of speaker 14 change only very slowly relative thereto. For example, the characteristics of feedback path 20 and/or error path 56 may change minute to minute, however the characteristics of speaker 14 will likely change only month to month, or week to week or day to day, etc. Speaker 14 is thus modeled off-line and calibrated, and assumed to be fixed or at least only changing very slowly relative to the other system parameters such as the characteristics of feedback path 20 and error path 56, especially temperature and flow rate.

It was found beneficial in the noted copending application Ser. No. 777,825, filed Sept. 19, 1985, to separately model error path 56 and speaker 14. It was also found beneficial to separately model the system portion from input microphone 10 to loudspeaker 14 and the system portion from loudspeaker 14 to error microphone 16. It was further found that overall attenuation was improved when the first error microphone 16 is placed downstream from cancelling loudspeaker 14 out of the complex acoustic field in region 18. It was further found that a third microphone (second error microphone 60) was needed to model the error path 56 to continue the desired separate modeling of error path 56 from the overall system, and separate modeling of error path 56 from the propagation path from input microphone 10 to speaker 14.

It was further found desirable to have a very accurate reading at error microphone 16. It was further found that the accuracy of the reading at the second error microphone 60 was not as critical as the reading at first error microphone 16. The noted copending application Ser. No. 777,825, filed Sept. 19, 1985, enables the use of such a non-critical reading at microphone 60 because the latter is used to measure and provide an input only for error path modeling, while the main system output accuracy requirement still depends upon error microphone 16. This is desirable because an accurate measurement of the acoustic wave propagating down the duct at area 18 may not be possible because of the complex acoustic field thereat proximate the output of speaker 14. This differential accuracy measurement is important because the output at 8 is the signal that is minimized by the model 40 and that should therefore accurately represent the noise that is to be reduced. The error path model 58, on the other hand, need only be determined with sufficient accuracy to insure convergence of model 40. The limited use of microphone 60 only for error path modeling and compensation is thus particularly advantageous.

In FIGS. 12 and 13, speaker 14 is modeled off-line to provide a fixed model S' of same. The copy of the fixed model S' of the speaker is provided at 80 and 82 in adaptive model 40. Speaker 14 is modeled by providing second error microphone or transducer 60 adjacent speaker 14, FIGS. 12 and 14, and providing an adaptive filter model S' at 84, FIG. 14. During a separate off-line pre-training process, line 46 is disconnected from summer 48 and a calibration or training signal is provided on line 46. The calibration signal at 46a provides an input to adaptive filter model 84 and speaker 14, and the outputs of error microphone 60 and adaptive filter model 84 are summed at summer 86 and the result is used as an error input 87 to speaker model 84. The error input 87 is multiplied at 90 with the calibration signal at 46a to provide weight update signal 88 to speaker model 84. Model 84 is fixed after it has adapted to and modeled speaker 14. The fixed model S' is then copied in model 40.

In the preferred embodiment in FIGS. 12 and 13, an input to speaker copy 80 is provided from input 42. The output of copy 80, after passing through error path model copy 70, is multiplied at 72 with the error signal at 44 and the result is used as the weight update signal 74 to algorithm filter 12. An input to speaker copy 82 is provided from the correction signal at 46. The output of copy 82, after passing through error path model copy 71, is multiplied at 76 with the error signal at 44 and the result is used as the weight update signal 78 to algorithm filter 22. As above, the correction signal at 46 may be summed with the error signal at 44, as at summer 52 in FIG. 9, and the result used as the input 47 to algorithm filter 22 and to copied speaker model 82.

Figure 14:
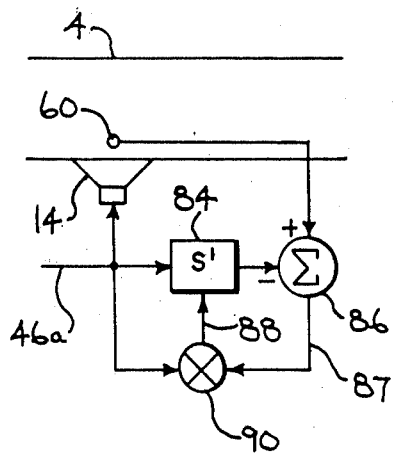
FIG. 14 is a schematic illustration for modeling a portion of the system of FIG. 13.
Figure 15:
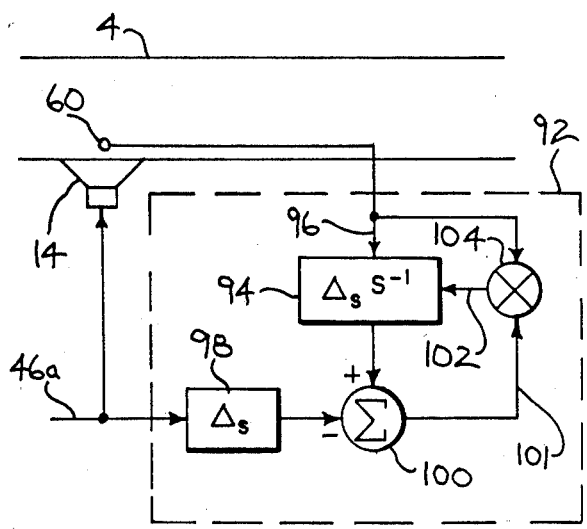
FIG. 15 is a schematic illustration of an alternate embodiment of FIG. 14.

FIG. 15 shows an alternative to the speaker modeling of FIG. 14. In FIG. 15, an adaptive filter model 92 has an adaptive delayed inverse portion 94 having an input 96 from second error microphone 60 and adaptively inversely modeling speaker 14. Model 92 has a delay portion 98 with an input from the calibration signal at 46a and yielding a delayed output of same. The calibration signal 46a is provided by disconnecting line 46 from the output of summer 48 and providing a training signal on disconnected line 46. The outputs of the delayed inverse and delay portions 94 and 98 are summed at summer 100 and the result is used as an error input 101 to the inverse portion 94. The error input 101 is multiplied with the model input 96 at multiplier 104 to provide weight update signal 102. Model 92 is fixed after it has adapted to and modeled speaker 14. The delayed inverse portion $\Delta_s\, S^{-1}$ at 94 is provided in series at 120, FIG. 16, with the output of the first error microphone 16. The delay portion $\Delta_s$ at 98 is provided at 122 and 124 in model 40, FIG. 16.

Figure 16:
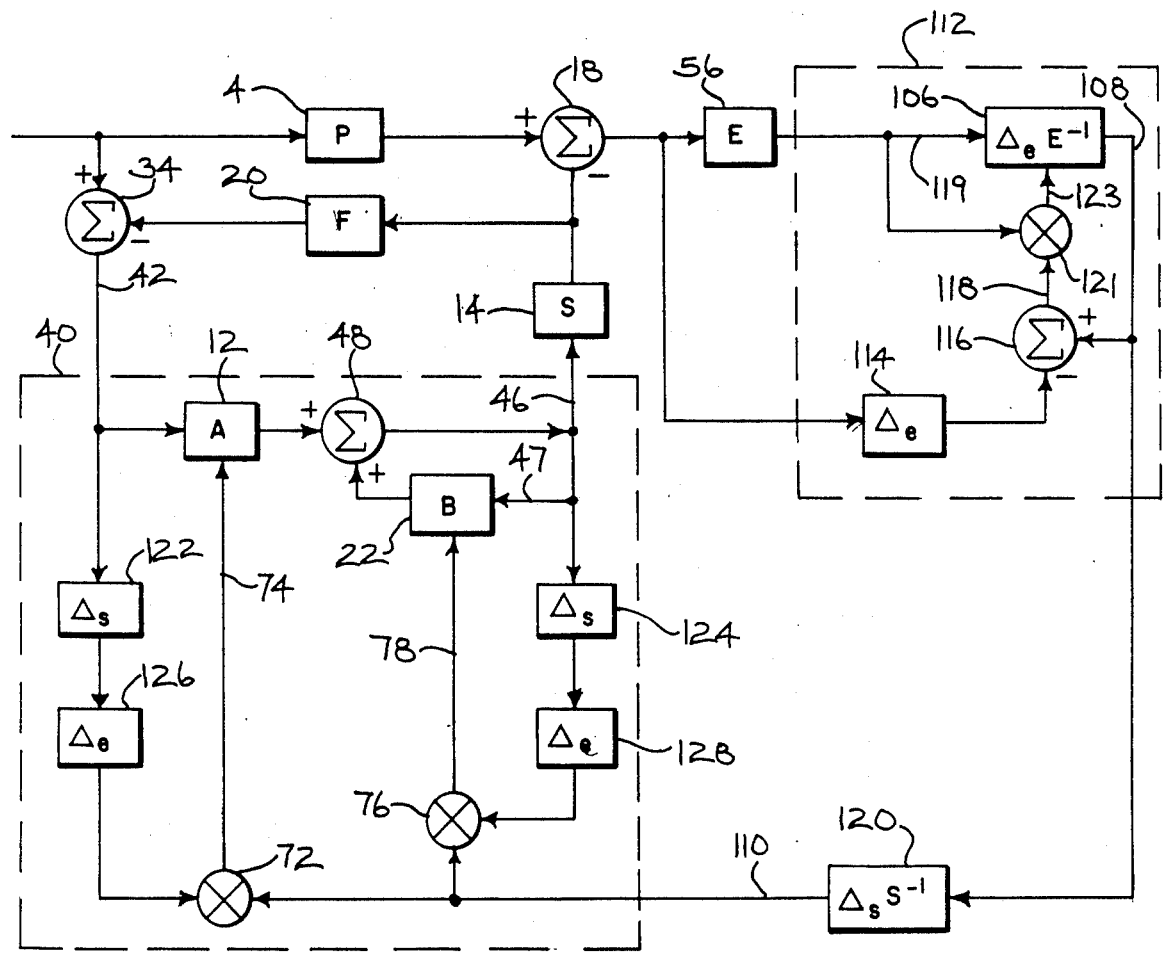
FIG. 16 is a schematic illustration of an alternate embodiment of FIG. 13.

FIG. 16 shows alternative modeling of the error path or plant 56. The adaptive model 112 for the error path is provided by an adaptive delayed inverse portion 106 having an input from the first error microphone 16 and inversely modeling the error path including delay and outputting an error signal at 108 to the error input at 110 of model 40. Model 112 has a delay portion 114, shown at $\Delta_e$, with an input from the second error microphone 60 and yielding a delayed output of same to summer 116. The outputs of the delayed inverse and delay portions 106 and 114, respectively, are summed at 116 and the result is the error input at 118 to inverse portion 106. The error signal 118 is multiplied with input 119 at multiplier 121 and the result provided as weight update signal 123 to inverse portion 106. The speaker 14 in FIG. 16 is modeled in accordance with FIG. 15, and the adaptive delayed inverse portion $\Delta_s S^{-1}$ is provided at 120 in series with the output of first error microphone 16 through adaptive inverse portion 106 of the error path model. Copies of the delay portion $\Delta_s$ of speaker model 92 are provided at 122 and 124 in adaptive system model 40. Copies of the delay portion $\Delta_e$ of the adaptive error path model 112 are provided at 126 and 128 in adaptive system model 40.

Adaptive system model 40 includes first and second algorithm filters 12 and 22 each having an error input 110 from the summing junction 18 through the error path 56, through the first error microphone 16, through the delayed inverse portion 106 of the adaptive on-line error path model 112 and through the delayed inverse portion 120 of the fixed model 92 of speaker 14. The net effect of these additions is to result in correction signal 46 passing through only delay portion $\Delta_e$ and $\Delta_s$ to provide error input 110. To compensate for this delay in the error path, copies 122 and 126 are provided in algorithm filter 12, and copies 124 and 128 are provided in algorithm filter 22. The input at 42 from input microphone 10 is provided to algorithm filter 12 and is also provided to the first series connected copies 122 and 126. The output of first copies 122 and 126 is multiplied at multiplier 72 with the error signal 110 through the delayed inverse portion 106 of adaptive error path model 112 and through the delayed inverse portion 120 of the fixed speaker model 92, and the result is used as the weight update signal 74 to algorithm filter 12. The correction signal at 46 to speaker 14 from summer 48 is also input to the second series connected copies 124 and 128. The output of the second copies 124 and 128 is multiplied at multiplier 76 with the error signal 110 and the result is used as the weight update signal 78 to algorithm filter 22.

Various combinations of FIGS. 13 and 16 may be utilized. In one combination, speaker 14 is modeled as in FIG. 14 to yield speaker model S', and the error path 56 is modeled as in FIG. 13 to yield error path model E', and the series connected models S' and E' are used in model 40 for each of the algorithms filters 12 and 22, as shown at 80 and 70, and at 82 and 71, in FIG. 13.

In another combination, speaker 14 is modeled as in FIG. 14, to yield speaker model S', and the error path 56 is modeled as in FIG. 16 to yield delayed inverse error path model 106. In this combination, model 40 includes speaker model 80 and delay portion $\Delta_e$ 126 of the adaptive error path model in algorithm filter 12, and includes speaker model 82 and delay portion 128 in algorithm filter 22.

In another combination, speaker 14 is modeled with delayed inverse model 94 as in FIG. 15, and the error path 56 is modeled with E' as in FIG. 13. Copies 122 and 70 are used in algorithm filter 12, and copies 124 and 71 are used in algorithm filter 22. Copy 120 is provided in series with the output of error microphone 16, and the error input to model 40 is provided through copy 120.

In another combination, copies 122 and 126 are used in algorithm filter 12, and copies 124 and 128 are used in algorithm filter 22, as shown in FIG. 16.

In further subcombinations with each of the above noted combinations, the correction signal at 46 is summed with the error signal at summer 52, FIG. 11, and the result is used as an input 47 to algorithm filter 22 and to multiplier 76 through speaker and error path compensation, e.g. 82 and 71, or 124 and 128, etc., as required.

Figure 17:
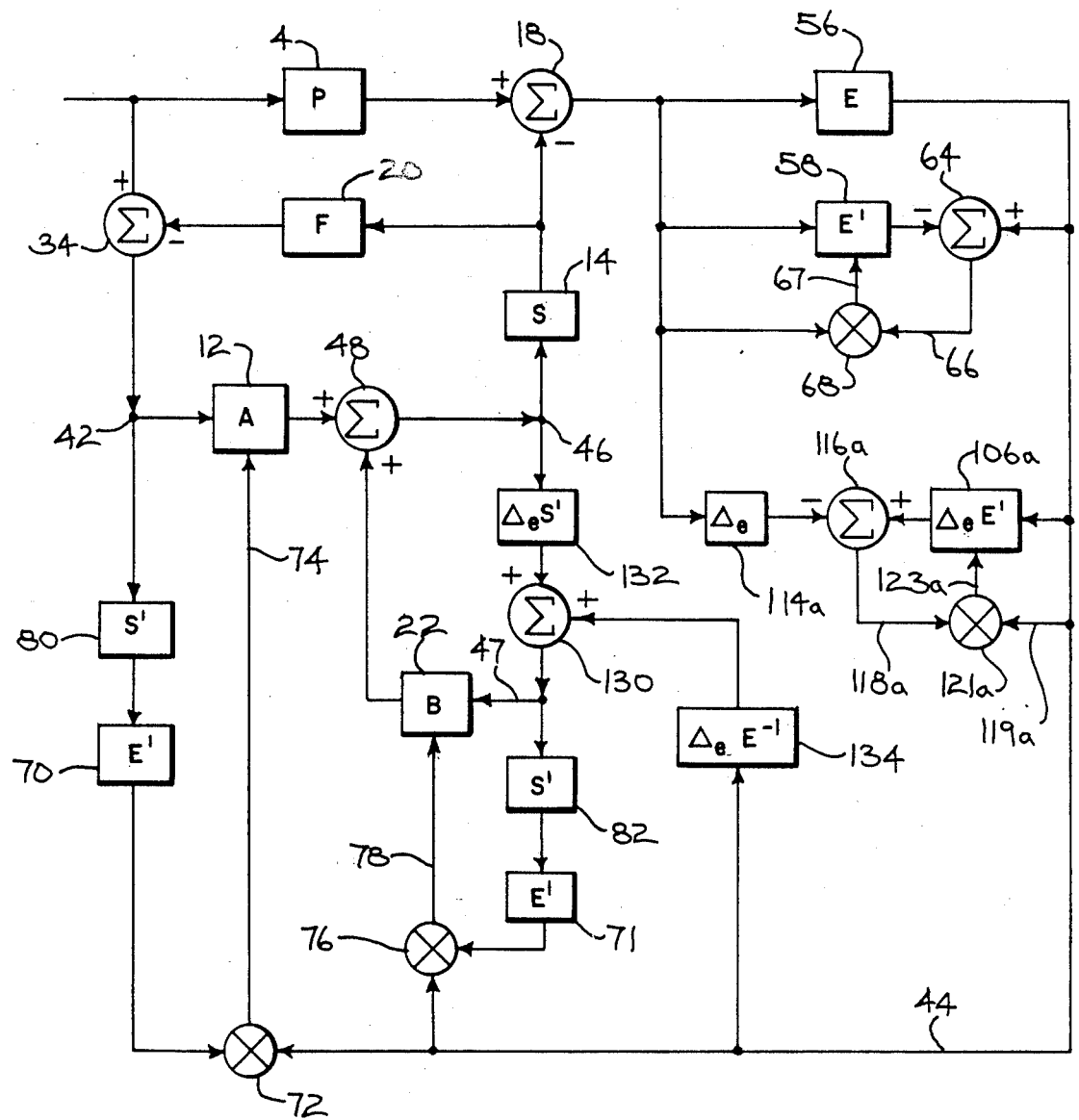
FIG. 17 is a schematic illustration of an alternate embodiment of FIG. 13.

FIG. 17 shows a further embodiment, and like reference numerals are used from FIGS. 13–16 where appropriate to facilitate clarity. The correction signal 46 is summed at summer 130 with error signal 44. Correction signal 46 is provided through a product 132 of a copy of the delay portion $\Delta_e$ of the adaptive error path model 112 and a copy of the model 84 of the output speaker 14 that has been fixed after adaptation. The error path 56 in FIG. 17 is additionally modeled as in FIG. 16, as shown at 106a, 114a, 116a, 118a, 119a, 121a and 123a, and a copy of inverse portion 106a is provided at 134. In this form, the error signal at 44 is provided to summer 130 through the adaptive delayed inverse portion 134 of the error path.

Figure 18:
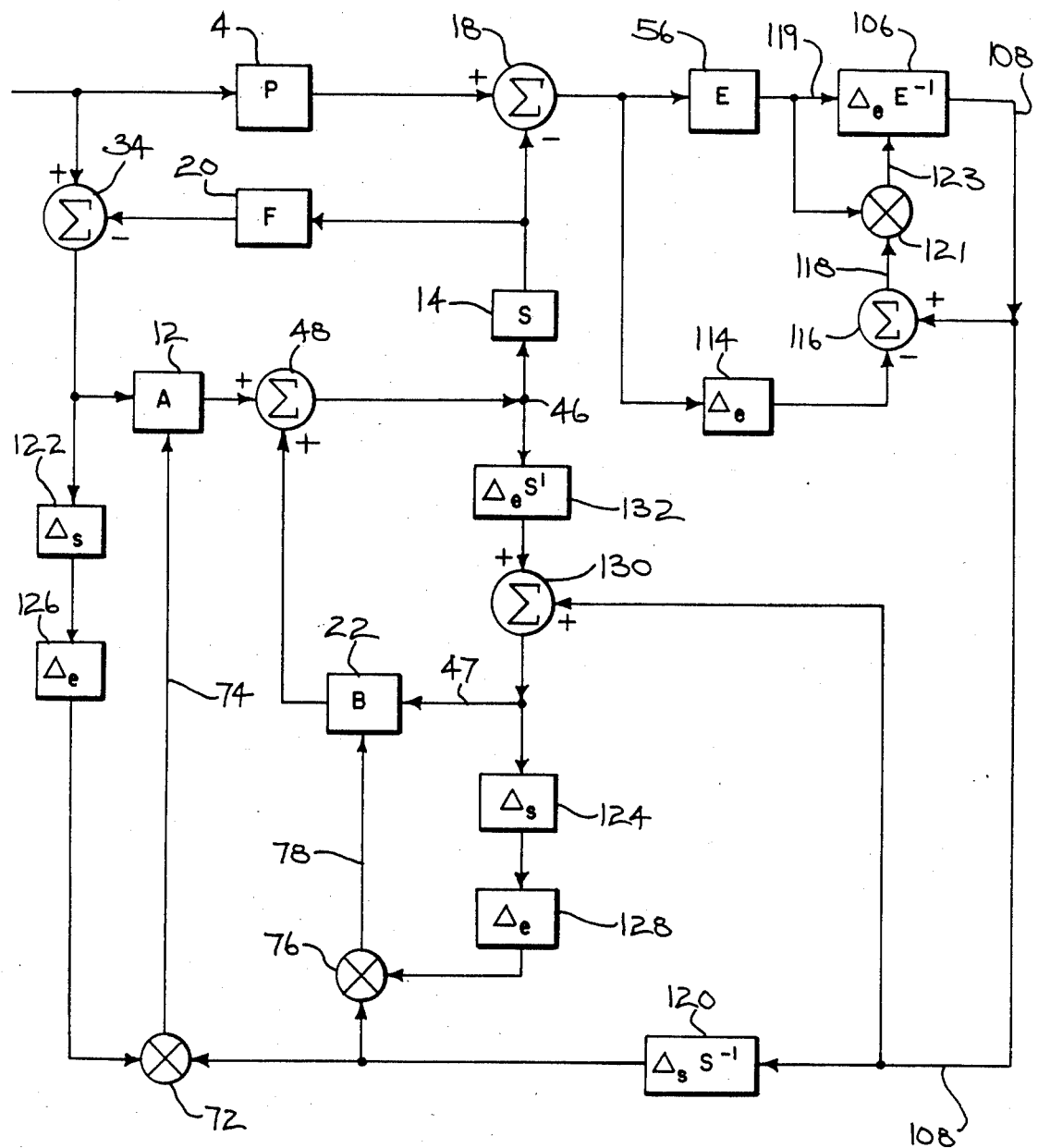
FIG. 18 is a schematic illustration of an alternate embodiment of FIG. 16.

FIG. 18 shows an alternate embodiment of FIG. 16 and like reference numerals from FIGS. 16 and 17 are used where appropriate to facilitate clarity. The error signal to summer 130 is provided through inverse portion 106 at 108 but not through the inverse portion 120 of the speaker model.

The above noted co-pending application Ser. No. 777,825, filed Sept. 19, 1985, provides copies of the error path and/or speaker in the system model. Model 40 includes model elements 106, 120, 134, etc., and the dashed line boxes in the drawings are not limiting.

Figure 19:
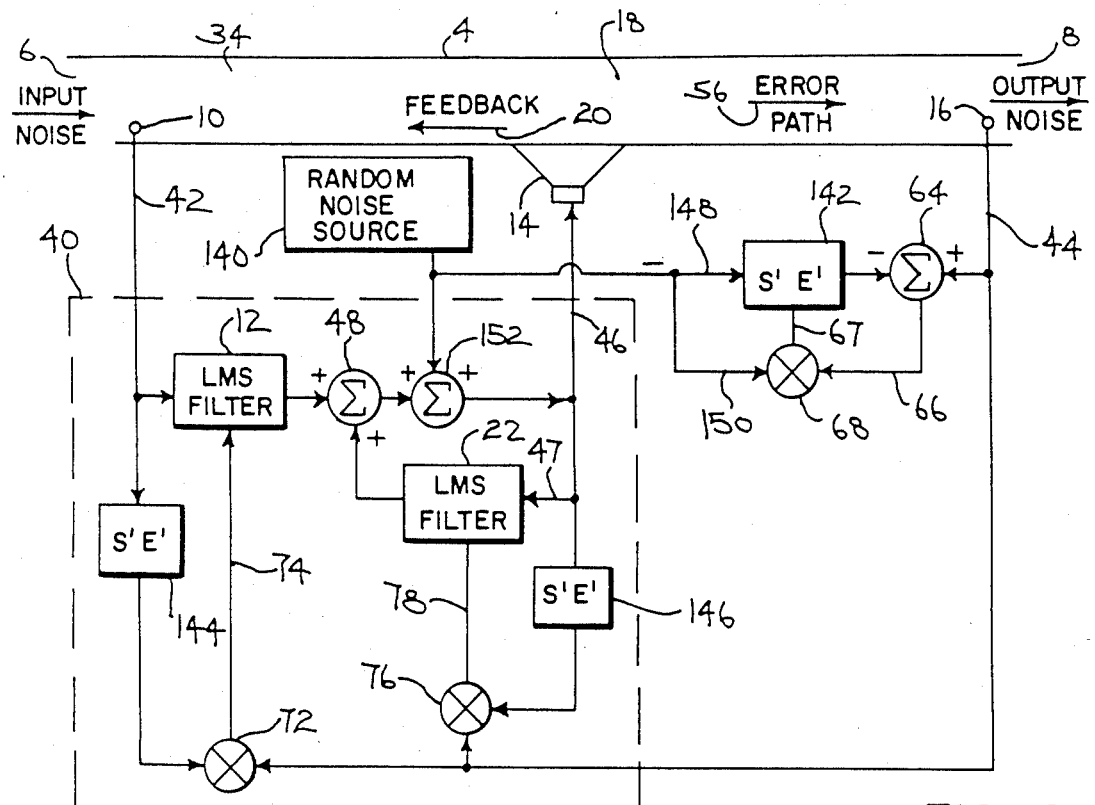
FIG. 19 is a block diagram of a system for acoustic modeling in accordance with the noted copending application Ser. No. 828,454, filed Feb. 11, 1986.
Figure 20:
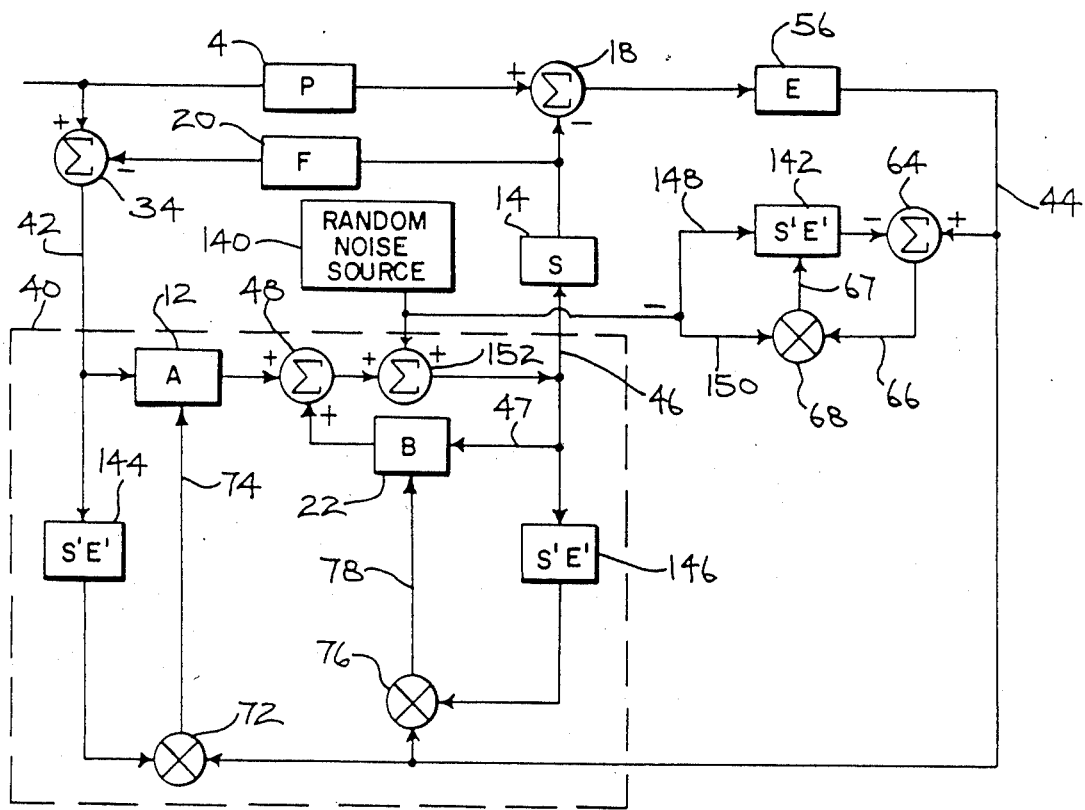
FIG. 20 is a schematic illustration of the system in FIG. 19.

FIGS. 19 and 20 show a system in accordance with above noted application Ser. No. 828,454, and like reference numerals are used from FIGS. 12 and 13 where appropriate to facilitate clarity. The acoustic system in FIG. 19 has an input at 6 for receiving an input acoustic wave and an output at 8 for radiating an output acoustic wave. An active attenuation system and method is provided for attenuating an undesirable output acoustic wave by introducing a cancelling acoustic wave from an output transducer such as speaker 14, and for adaptively compensating for feedback along feedback path 20 to input 6 from speaker or transducer 14 for both broad band and narrow band acoustic waves, on-line without off-line pre-training, and providing adaptive modeling and compensation of error path 56 and adaptive modeling and compensation of speaker or transducer 14, all on-line without off-line pre-training.

Input transducer or microphone 10 senses the input acoustic wave at 6. The combined output acoustic wave and cancelling acoustic wave from speaker 14 are sensed with an error microphone or transducer 16 spaced from speaker 14 along error path 56 and providing an error signal at 44. The acoustic system or plant P is modeled with adaptive filter model 40 provided by filters 12 and 22 and having a model input at 42 from input microphone 10 and an error input at 44 from error microphone 16. Model 40 outputs a correction signal at 46 to speaker 14 to introduce cancelling sound such that the error signal at 44 approaches a given value, such as zero. Feedback path 20 from speaker 14 to input microphone 10 is modeled with the same model 40 by modeling feedback path 20 as part of the model 40 such that the latter adaptively models both the acoustic system P and the feedback path F, without separate modeling of the acoustic system and feedback path, and without a separate model pre-trained off-line solely to the feedback path with broad band noise and fixed thereto.

An auxiliary noise source 140 introduces noise into the output of model 40. The auxiliary noise source is random and uncorrelated to the input noise at 6, and in preferred form is provided by a Galois sequence, M. R. Schroeder, *Number Theory in Science and Communications*, Berlin: Springer-Verlag, 1984, pp. 252–261, though other random uncorrelated noise sources may of course be used. The Galois sequence is a pseudorandom sequence that repeats after $2^M - 1$ points, where M is the number of stages in a shift register. The Galois sequence is preferred because it is easy to calculate and can easily have a period much longer than the response time of the system.

Model 142 models both the error path E 56 and the speaker or output transducer S 14 on-line. Model 142 is a second adaptive filter model provided by a LMS filter. A copy S'E' of the model is provided at 144 and 146 in model 40 to compensate for speaker S 14 and error path E 56.

Second adaptive filter model 142 has a model input 148 from auxiliary noise source 140. The error signal output 44 of error path 56 at output microphone 16 is summed at summer 64 with the output of model 142 and the result is used as an error input at 66 to model 142. The sum at 66 is multiplied at multiplier 68 with the auxiliary noise at 150 from auxiliary noise source 140, and the result is used as a weight update signal at 67 to model 142.

The outputs of the auxiliary noise source 140 and model 40 are summed at 152 and the result is used as the correction signal at 46 to input speaker 14. Adaptive filter model 40, as noted above, is provided by first and second algorithm filters 12 and 22 each having an error input at 44 from error microphone 16. The outputs of first and second algorithm filters 12 and 22 are summed at summer 48 and the resulting sum is summed at summer 152 with the auxiliary noise from auxiliary noise source 140 and the resulting sum is used as the correction signal at 46 to speaker 14. An input at 42 to algorithm filter 12 is provided from input microphone 10. Input 42 also provides an input to model copy 144 of adaptive speaker S and error path E model. The output of copy 144 is multiplied at multiplier 72 with the error signal at 44 and the result is provided as weight update signal 74 to algorithm filter 12. The correction signal at 46 provides an input 47 to algorithm filter 22 and also provides an input to model copy 146 of adaptive speaker S and error path E model. The output of copy 146 and the error signal at 44 are multiplied at multiplier 76 and the result is provided as weight update signal 78 to algorithm filter 22.

Auxiliary noise source 140 is an uncorrelated low amplitude noise source for modeling speaker S 14 and error path E 56. This noise source is in addition to the input noise source at 6 and is uncorrelated thereto, to enable the S'E' model to ignore signals from the main model 40 and from plant P. Low amplitude is desired so as to minimally affect final residual acoustical noise radiated by the system. The second or auxiliary noise from source 140 is the only input to the S'E' model 142, and thus ensures that the S'E' model will correctly characterize SE. The S'E' model is a direct model of SE, and this ensures that the RLMS model 40 output and the plant P output will not affect the final converged model S'E' weights. A delayed adaptive inverse model would not have this feature. The RLMS model 40 output and plant P output would pass into the SE model and would affect the weights.

The system needs only two microphones. The auxiliary noise signal from source 140 is summed at junction 152 after summer 48 to ensure the presence of noise in the acoustic feedback path and in the recursive loop. The system does not require any phase compensation filter for the error signal because there is no inverse modeling. The amplitude of noise source 140 may be reduced proportionate to the magnitude of error signal 66, and the convergence factor for error signal 44 may be reduced according to the magnitude of error signal 44, for enhanced long term stability, "Adaptive Filters: Structures, Algorithms, And Applications", Michael L. Honig and David G. Messerschmitt, The Kluwer International Series in Engineering and Computer Science, VLSI, Computer Architecture And Digital Signal Processing, 1984.

As noted in application Ser. No. 828,454, a desirable feature of such system is that it requires no calibration, no pre-training, no pre-setting of weights, and no start-up procedure. One merely turns on the system, and the system automatically compensates and attenuates undesirable output noise.

In other implementations of above noted application Ser. No. 828,454, directional speakers and/or microphones are used and there is no feedback path modeling. In other implementations, the input microphone is eliminated and replaced by a synchronizing source for the main model 40 such as an engine tachometer. In other implementations, a high grade or near ideal speaker is used and the speaker transfer function is unity, whereby model 142 models only the error path. In other implementations, the error path transfer function is unity, e.g., by shrinking the error path distance to zero or placing the error micro phone 16 immediately adjacent speaker 14, whereby model 142 models only the cancelling speaker 14.

Figure 21:
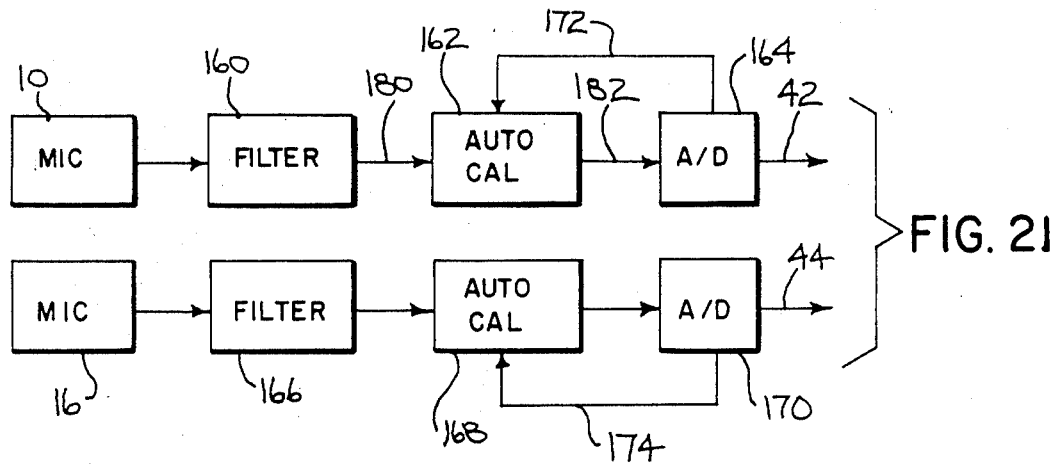
FIG. 21 is a block diagram of a system for acoustic modeling in accordance with the invention.
Figure 22:
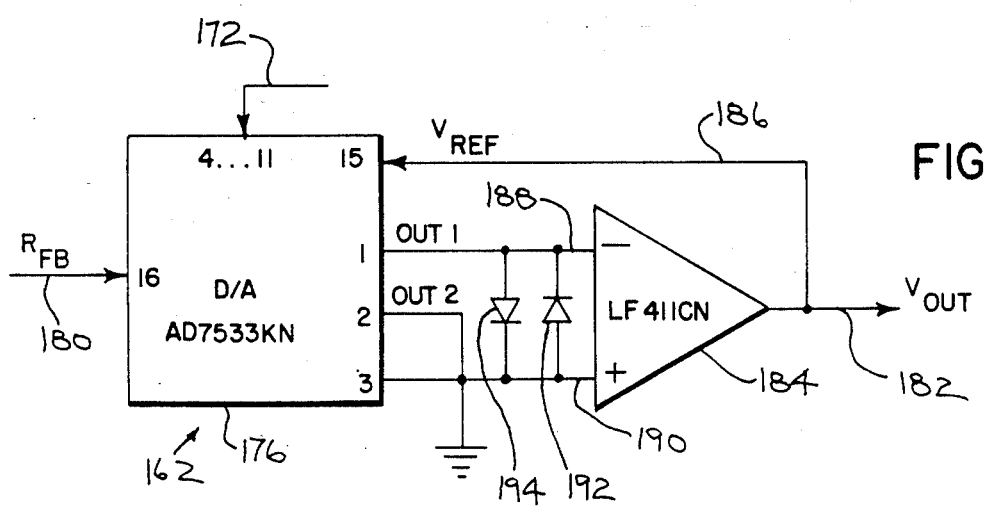
FIG. 22 is a schematic circuit illustration of a portion of the system in FIG. 21.

FIGS. 21 and 22 show a system in accordance with the present invention, and like reference numerals are used from FIGS. 1–20 where appropriate to facilitate clarity. The invention provides increased dynamic range with automatic self-calibration.

Input microphone 10 provides an analog signal which is passed through a low pass filter 160 and an automatic self-calibration circuit 162 and then converted by analog to digital converter 164 to a digital input signal on line 42 for input to model 40. Error microphone 16 outputs an analog signal which is passed through a low pass filter 166 and an automatic self-calibration circuit 168 and converted by analog to digital converter 170 to a digital error signal on line for input to the model. Analog to digital converter and/or model 40 sense the amplitude of the input signal from input microphone 10 and control via line 172 the amplification of the input signal by amplifying calibration circuit 162, to adjust the amplitude of the input signal at the model input to be in a desired range and provide automatic calibration of the input signal and increased dynamic range of the model. The amplitude of the error signal from error microphone 16 is sensed by analog to digital converter 170 and/or the model which control via line 174 the amplification of the error signal by calibration circuit 168 to adjust the amplitude of the error signal to be in a desired range for the model and provide automatic calibration of the error signal and increased dynamic range of the model.

Calibration circuit 162 is provided by a digital to analog converter 176, FIG. 22, such as an Intersil AD7533KN integrated circuit chip, where manufacturer assigned pin number designations are used for clarity. Terminal pins 4 through 11 are the digital input for the digital input signal on line 172. Digital to analog converter 176 is operated in an analog to analog mode from analog input voltage on line 180 to analog output voltage on line 182. The analog input voltage on line 180 is from input microphone 10 through low pass filter 160, and is supplied to the feedback port, RFB, at terminal pin 16. The analog output voltage on line 182 is supplied to analog to digital converter 164 from the output of operational amplifier 184, such as an LF411CN, and is also connected via line 186 to the reference voltage port, $V_{REF}$, at terminal pin 15. Digital to analog converter 176 has first and second analog outputs, OUT 1 and OUT 2, at pins 1 and 2, connected to respective minus and plus comparing inputs 188 and 190 of operational amplifier 184. Pins 2 and 3 are connected together and grounded For further information regarding the connection and operation of digital to analog converter 176 and operational amplifier 184, reference is made to the Intersil data sheet for the AD7523, FIG. 6. Digital to analog converter 176 and operational amplifier 184 amplify the voltage input at 180 to an amplified output voltage at 182 according to the digital value of the input signal at 172.

A first diode 192 is connected between the comparing inputs 188 and 190 of the operational amplifier, and a second diode 194 is connected between comparing inputs 188 and 190 in opposite polarity relation to first diode 192. These diodes ensure proper voltage limiting between such comparing inputs and proper operation of operational amplifier 184. Calibration circuit 168 is comparable to circuit 162.

In an alternative embodiment, analog to digital converters 164 and 170 are replaced by a multiplexer and a single analog to digital converter which services both the input signal and the error signal in time division multiplexed manner, and which may also replace lines 172 and 174 with a single line to both circuits 162 and 168 which in turn demultiplex the respective signal. The two analog to digital converter version is preferred for high speed applications. The single analog to digital converter version is used for lower speed applications.

Figure 23:
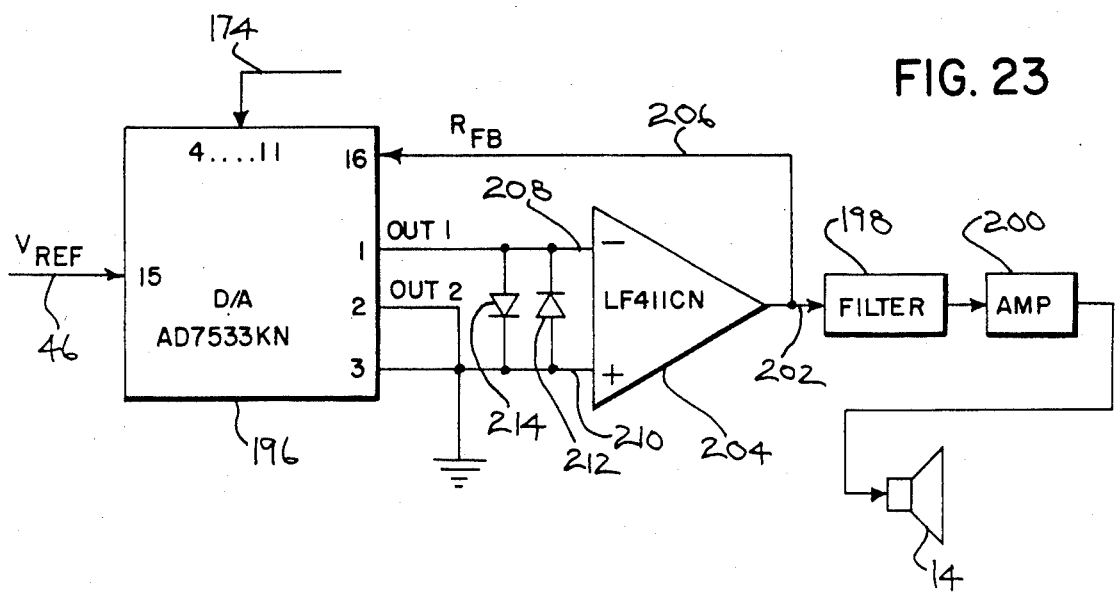
FIG. 23 shows circuitry for increasing the dynamic of the system with calibration circuitry adjusting the amplitude of the output correction signal on line 46 of FIG. 19.

FIG. 23 shows circuitry for increasing dynamic range of the system with calibration circuitry adjusting the amplitude of the output correction signal on line 46, FIG. 19, to output transducer or speaker 14. The calibration circuit is provided by a digital to analog converter 196, such as an Intersil AD7533KN integrated circuit chip, where manufacturer assigned pin number designations are used for clarity. Digital to analog converter 196 is operated in an analog to analog mode with an analog input from the correction signal on line 46 and an analog output to speaker 14 through a low pass filter 198 and a power amplifier 200. Terminal pins 4–11 are the digital input, preferably from the digital input signal on line 174. The analog input voltage on line 46 is received at the voltage reference terminal port, $V_{REF}$, pin 15. The analog output voltage at 202 is supplied from the output of operational amplifier 204, such as an LF411CN, and is also connected via line 206 to the feedback terminal port, RFB, pin 16. Digital to analog converter 196 has first and second analog outputs, OUT 1 and OUT 2, at pins 1 and 2, connected to respective minus and plus comparing inputs 208 and 210 of operational amplifier 204. Pins 2 and 3 are connected together and grounded. Digital to analog converter 196 and operational amplifier 204 amplify the voltage input at 46 to an amplified output voltage at 202 according to the digital value of the input signal at 174. A first diode 212 is connected between the comparing inputs 208 and 210 of operational amplifier 204, and a second diode 214 is connected between the comparing inputs 208 and 210 in opposite polarity relation to first diode 212. These diodes ensure proper voltage limiting between such comparing inputs and proper operation of operational amplifier 204.

It is to be understood that the acoustic system of the invention includes any system with propagating acoustic waves, including infrasonic (low frequency), sonic, or ultrasonic (high frequency) systems as well as gas (e.g. air) or liquid (water) filled systems. The input and error transducers convert acoustic pressure to electrical voltage, and the output transducer converts electrical voltage to acoustic pressure. It is recognized that various equivalents, alternatives and modifications are possible within the scope of the appended claims.

We claim:

1. In an acoustic system having an input for receiving an input acoustic wave and an output for radiating an out put acoustic wave, an active attenuation method for attenuating undesirable said output acoustic wave by introducing a cancelling acoutic wave from an output transducer, comprising:

sensing said input acoustic wave with an input transducer and providing an input signal;

sensing the combined said output acoustic wave and said cancelling acoustic wave from said output transducer with an error transducer and providing an error signal;

modeling said acoustic system with an adaptive filter model having a model input trom said input transducer and an error input from said error transducer and outputting a correction signal to said outpt transducer to introduce the cancelling acoustic wave such that said error signal approaches a given value;

increasing the dynamic range of said modeling by adjusting the amplitude of said input signal at said model input;

providing amplifier means at said model input for amplifying said input signal, providing means responsive to the amplitude of said input signal and controlling amplification by said amplifier means to calibrate said input signal;

providing an analog said input signal from said input transducer;

converting said analog input signal to a digital input signal with an analog to digital converter for input to said model;

providing a digital to analog converter having a digital input from said digital input a signal;

operating said digital to analog converter in an analog to analog mode with an analog input from said input transducer and with an analog output to said analog to digital converter.

2. The invention according to claim 1 comprising providing a second digital to analog converter and operating said second digital to analog converter in an analog to analog mode with an analog input from said correction signal and an analog output to said output transducer.

3. In an acoustic system having an input for receiving an input acoustic wave and an output for radiating an output acoustic wave, active attenuation apparatus for attenuating undesirable said output acoustic wave by introducing a cancelling acoustic wave from an output transducer, comprising:

an input transducer sensing said input acoustic wave and providing an input signal;

an error transducer sensing the combined said output acoustic wave and said cancelling acoustic wave from said output transducer and providing an error signal;

an adaptive filter model adaptively modeling said acoustic system on-line and having a model input from said input transducer and an error input from said error transducer and outputting a correction signal to said output transducer to introduce the cancelling acoustic wave such that said error signal approaches a given value;

means for increasing the dynamic range of said system comprising calibration means for adjusting the amplitude of said correction signal;

wherein said calibration means comprises digital to analog converter means operated in an analog to analog mode having an analog input from said correction signal and an analog output to said output transducer.

4. The invention according to claim 3 wherein said digital to analog converter means comprises:

a digital to analog converter having a voltage reference terminal receiving said correction signal, a feedback reference terminal, and first and second analog output terminals;

operational amplifier means having a pair of comparing inputs connected to respective said first and second analog output terminals, said operational amplifier means having an analog voltage output terminal connected to said feedback reference terminal and providing an analog output voltage to said output transducer.

5. In an acoustic system having an input for receiving an input acoustic ware and an output for radiating anoutput acoustic wave, an active attenuation method for attenuating undesirable said output acoustic wave by introducing a cancelling acoustic wave from an output transducer, comprising:

sensing said input acoustic wave with an input transducer and providing an input signal;

sensing the combined said output acoustic wave and said cancelling acoustic wave from said output transducer with an error transducer and providing an error signal;

modeling said acoustic system with an adaptive filter model having a model input from said input transducer and an error input from said error transducer and outputting a correction signal to said output transducer to introduce the cancelling acoustic wave such that said error signal approaches a given value;

increasing the dynamic range of said modeling by adjusting the amplitude of said input signal at said model input;

also increasing said dynamic range of said modeling by adjusting the amplitude of said error signal at said error input to said model.

6. The invention according to claim 5 comprising providing first and second amplifier means at respective said model input and said error input for amplifying respective said input and error signals, providing first and second means responsive to the amplitude of respective said input and error signals and controlling amplification by respective said first and second amplifier means to calibrate said input and error signals.

7. The invention according to claim 6 comprising:

providing analog said input and error signals from said input and error transducers;

converting said analog input and error signals to digital input and error signals from analog to digital converter means for input to said model;

providing first and second digital to analog converters havng digital inputs from respective said digital input and error signals;

operating said first and second digital to analog converters in analog to analog modes with analog inputs from respective input and error transducers and with analog outputs to said analog to digital converter means.

8. The invention according to claim 7 comprising:

adaptively compensating for feedback to said input from said output transducer for both broad band and narrow band acoustic waves on-line without off-line pre-training, and providing both adaptive error path compensation and adaptive compensation of said output transducer on-line without off-line pre-training;

modeling the feedback path from said output transducer to said input transducer with the same said model by modeling said feedback path as part of said model such that the latter adaptively models both said acoustic system and said feedback path, without separate modeling of said acoustic system and said feedback path, and without a separate model pre-trained off-line solely to said feedback path;

providing an auxiliary noise source and introducing noise therefrom into said model, such that said error transducer also senses the auxiliary noise from said auxiliary noise source;

modeling both said error path and said output transducer on-line with a said adaptive filter model, and providing a copy of said second adaptive filter model in said first mentioned adaptive filter model to compensate for said output transducer and said error path.

9. The invention according to claim 8 comprising:

introducing noise from said auxiliary noise source which is random and uncorrelated to said input acoustic wave;

providing said second adaptive filter model having a model input from said auxiliary noise source.

10. The invention according to claim 9 comprising providing a third digital to analog converter and operating said third digital to analog converter in an analog to analog mode with an analog input from said correction signal and an analog output to said output transducer.

11. In an acoustic system having an input for receiving an input acoustic wave and an output for ratiating an output acoustic wave, an active attenuation method for attenuating undesirable said output acoustic wave by introducing a cancelling acoustic wave from an output transducer, comprising:

sensing said input acoustic wave with an input transducer and providing an input signal;

sensing the combined said output acoustic wave and said cancelling acoustic save from said output transducer with an error transducer and providing an error signal;

modeling said acoustic system with an adaptive filter model having a model input from said input transducer and an error input from said error transducer and outputting a correction signal to said output transducer to introduce the cancelling acoustic wave such that said error signal approaches a given value;

increasing the dynamic range of said system by adjusting the amplitude of said correction signal;

providing a digital to analog converter and operating it in an analog to analog mode with an analog input from said correction signal and an analog output to said output transducer.

12. In an acoustic system having an input for receiving an input acoustic wave and an output for radiating an output acoustic wave, active attenuation apparatus for attenuating undesirable said output acoustic wave by introducing a cancelling acoustic wave from an output transducer, comprising:

an input transducer sensing said input acoustic wave and providing an input signal;

an error transducer sensing the combined said output acoustic wave and said cancelling acoustic wave from said output transducer and providing an error signal;

an adaptive filter model adaptively modeling said acoustic system on-line and having a model input from said input transducer and an error input from said error transducer and outputting a correction signal to said output transducer to introduce the cancelling acoustic wave such that said error signal approaches a given value;

means for increasing the dynamic range of said model comprising means for sensing the amplitude of said input signal and calibration means responsive thereto for adjusting the amplitude of said input signal.

13. The invention according to claim 12 wherein said input transducer provides an analog said input signal, and comprising:

analog to digital converter means for converting said analog input signal to a digital input signal for input to said model;

digital to analog converter means having a digital input from said digital input signal, and having an analog input from said input transducer and having an analog output to said analog to digital converter means.

14. The invention according to claim 13 wherein said digital to analog converter means comprises:

a digital to analog converter having a feedback reference terminal providing an analog voltage input from said input transducer, a voltage reference terminal, first and second analog output terminals, and a plurality of digital input terminals;

operational amplifier means having a pair of comparing inputs connected to respective said first and second analog output terminals, said operational amplifier means having an analog voltage output terminal connected to said voltage reference terminal of said digital to analog converter and providing said analog output voltage to said analog to digital converter means.

15. The invention according to claim 14 comprising a first diode connected between said comparing inputs of said operational amplifier means, and a second diode connected between said comparing inputs of said operational amplifier means in opposite polarity relation to said first diode.

16. The invention according to claim 13 comprising means for adaptively compensating for feedback to said input transducer from said output transducer for both broad band and narrow band acoustic waves on-line without off-line pre-training and for providing both adaptive error path compensation and adaptive compensation of said output transducer on-line without off line pre-training, and comprising:

an auxiliary noise source introducing auxiliary noise into said adaptive filter model which is random and uncorrelated with said input acoustic wave;

a second adaptive filter model adaptively modeling both said error path and said output transducer on-line without dedicated off-line pre-training; and a copy of said second adaptive filter model in said first adaptive filter model to compensate for both said error path and said output transducer adaptively on-line.

17. The invention according to claim 16 wherein:

said second adaptive filter model has a model input from said auxiliary noise source, and comprising summer means summing the outputs of said error path and said second adaptive filter model and outputting the result as an error input to said second adaptive filter model;

said second adaptive filter model comprises algorithm means, and comprising multiplier means multiplying the output of said summer means with said auxiliary noise from said auxiliary noise source and applying the result as a weight update signal to said algorithm means, and comprising second summer means summing auxiliary noise from said auxiliary noise source with the output of said first adaptive filter model and supplying the result as said correction signal to said output transducer;

said first adaptive filter model comprises first and second algorithm means each having an error input from said error transducer, and comprising third summer means summing the outputs of said first and second algorithm means of said first adaptive filter model and using the result as an input to said second summer means for summing with said auxiliary noise, and comprising a first copy of said second adaptive filter model of said error path and said output transducer in said first algorithm means of said first adaptive filter model, and comprising a second copy of said second adaptive filter model of said error path and said output transducer in said second algorithm means of said first adaptive filter model;

said first algorithm means of said first adaptive filter model has an input from said input transducer, said first copy of said second adaptive filter model has an input from said input transducer, and comprising first multiplier means multiplying the output of said first copy with said error signal and using the result as a weight update signal to said first algorithm means of said first adaptive filter model;

said second algorithm means of sid first adaptive filter model has an input from said correction signal, said second copy of said second adaptive filter model has an input from said correction signal, and comprising second multiplier means multiplying the output of said second copy with said error signal and using the result as a weight update signal to said second algorithm means of said first adaptive filter model.

18. The invention according to claim 17 comprising means for increasing the dynamic range of said first adaptive filter model by adjusting the amplitude of said error signal at said error input to said first adaptive filter model.

19. The invention according to claim 18 wherein said error transducer provides an analog said error signal, and said analog to digital converter means converts said analog error signal to a digital error signal for input to said first adaptive filter model, and comprising second digital to analog converter means having a digital input from said digital error signal and having an analog input from said error transducer and having an analog output to said second analog to digital converter means.

20. The invention according to claim 19 comprising third digital to analog converter means operated in an analog to analog mode having an analog input from said correction signal and an analog output to said output transducer.

21. The invention according to claim 20 wherein said third digital to analog converter means comprises:

a digital to analog converter having a voltage reference terminal receiving said correction signal, a feedback reference terminal, and first and second analog output terminals;

operational amplifier means having a pair of comparing inputs connected to respective last mentioned said first and second analog output terminals, said operational amplifier means having an analog voltage output terminal connected to said last mentioned feedback reference terminal and providing an analog output voltage to said output transducer.

* * * * *